US010435506B2

(12) United States Patent
Mitchell et al.

(10) Patent No.: US 10,435,506 B2
(45) Date of Patent: Oct. 8, 2019

(54) THIADIAZOLOPYRIDINE POLYMERS, THEIR SYNTHESIS AND THEIR USE

(71) Applicant: MERCK PATENT GMBH, Darmstadt (DE)

(72) Inventors: William Mitchell, Chandler's Ford (GB); Mansoor D'Lavari, Bude (GB)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 15/573,257

(22) PCT Filed: Apr. 27, 2016

(86) PCT No.: PCT/EP2016/000674
§ 371 (c)(1),
(2) Date: Nov. 10, 2017

(87) PCT Pub. No.: WO2016/180515
PCT Pub. Date: Nov. 17, 2016

(65) Prior Publication Data
US 2018/0105637 A1    Apr. 19, 2018

(30) Foreign Application Priority Data
May 12, 2015 (EP) .................................. 15167266

(51) Int. Cl.
| | | |
|---|---|---|
| C08G 61/12 | (2006.01) | |
| C08G 79/00 | (2006.01) | |
| C08G 75/00 | (2006.01) | |
| C08G 75/02 | (2016.01) | |
| C08G 75/32 | (2006.01) | |
| C08L 65/00 | (2006.01) | |
| H01L 51/00 | (2006.01) | |
| C08K 3/04 | (2006.01) | |
| H01L 51/42 | (2006.01) | |
| H01L 51/50 | (2006.01) | |

(52) U.S. Cl.
CPC ......... *C08G 61/126* (2013.01); *C08G 61/122* (2013.01); *C08G 61/123* (2013.01); *C08G 61/124* (2013.01); *C08G 75/00* (2013.01); *C08G 75/02* (2013.01); *C08G 75/32* (2013.01); *C08G 79/00* (2013.01); *C08K 3/045* (2017.05); *C08L 65/00* (2013.01); *H01L 51/0036* (2013.01); *H01L 51/0043* (2013.01); *H01L 51/0094* (2013.01); *C08G 2261/12* (2013.01); *C08G 2261/122* (2013.01); *C08G 2261/1412* (2013.01); *C08G 2261/3241* (2013.01); *C08G 2261/3243* (2013.01); *C08G 2261/3246* (2013.01); *C08G 2261/344* (2013.01); *C08G 2261/414* (2013.01); *C08G 2261/90* (2013.01); *C08G 2261/91* (2013.01); *C08G 2261/92* (2013.01); *C08G 2261/94* (2013.01); *C08G 2261/95* (2013.01); *H01L 51/42* (2013.01); *H01L 51/4253* (2013.01);

*H01L 51/50* (2013.01); *H01L 51/5012* (2013.01); *H01L 51/5056* (2013.01); *H01L 51/5072* (2013.01); *H01L 51/5096* (2013.01); *Y02E 10/549* (2013.01); *Y02P 70/521* (2015.11)

(58) Field of Classification Search
CPC .. C08G 61/126; C08G 61/122; C08G 61/123; C08G 61/124; C08G 79/00; C08G 75/02; C08G 75/00; C08G 75/32; C08G 2261/3243; C08G 2261/90; C08G 2261/94; C08G 2261/344; C08G 2261/3241; C08G 2261/1412; C08G 2261/122; C08G 2261/12; C08G 2261/95; C08G 2261/92; C08G 2261/91; C08G 2261/414; C08G 2261/3246; C08K 3/045; H01L 51/0094; H01L 51/0043; H01L 51/0036; H01L 51/5096; H01L 51/5072; H01L 51/5056; H01L 51/4253; H01L 51/5012; H01L 51/50; H01L 51/42; C08L 65/00; Y02P 70/521; Y02E 10/549
USPC .............................................. 252/501.1, 500
See application file for complete search history.

(56) References Cited

U.S. PATENT DOCUMENTS

| | | | | |
|---|---|---|---|---|
| 2012/0074410 A1* | 3/2012 | Mishra | ................. | C08G 61/123 257/57 |
| 2012/0322966 A1 | 12/2012 | Bazan | | |
| 2013/0200354 A1* | 8/2013 | Zhu | ..................... | H01L 51/0043 257/40 |
| 2013/0200355 A1* | 8/2013 | Zhu | ..................... | H01L 51/0043 257/40 |
| 2013/0331530 A1 | 12/2013 | Bazan | | |
| 2014/0339477 A1* | 11/2014 | Waller | ............... | H01L 51/0094 252/500 |
| 2015/0076418 A1* | 3/2015 | Blouin | .................... | C08K 3/04 252/511 |

FOREIGN PATENT DOCUMENTS

| | | |
|---|---|---|
| JP | 2013237813 A | 11/2013 |
| WO | 2010022058 A1 | 2/2010 |
| WO | 2011156478 A2 | 12/2011 |
| WO | 2012118728 A2 | 9/2012 |
| WO | WO-2017102058 A1 * | 6/2017 ......... H01L 51/0003 |

OTHER PUBLICATIONS

International Search Report PCT/EP2016/000674 dated Jun. 22, 2016.
(Continued)

*Primary Examiner* — Douglas J McGinty
(74) *Attorney, Agent, or Firm* — Millen White Zelano & Branigan, PC

(57) ABSTRACT

The present invention relates to thiadiazolopyridine polymers, their synthesis and their use. The present invention further relates to organic electronic devices comprising such thiadiazolopyridine polymers.

23 Claims, 2 Drawing Sheets

(56) References Cited

OTHER PUBLICATIONS

Jong Soo Kim et al: "A comparison between dithienosilole and dithienogermole donor-acceptor type co-polymers for organic bulk heterojunction photovoltaic devices", Journal of Materials Chemistry, vol. 22, No. 19, Jan. 1, 2012 (Jan. 1, 2012), GB, pp. 9975, XP055219038, ISSN: 0959-9428.

Gregory L. Gibson et al: "Effect of Group-14 and Group-16 Substitution on the Photophysics of Structurally Related Donor-Acceptor Polymers", Journal of Physical Chemistry C, vol. 117, No. 32, Aug. 15, 2013 (Aug. 15, 2013), pp. 16606-16615, XP055195607, ISSN: 1932-7447.

Blouin N et al: "Toward a rational design of Poly(2,7-carbazole) Derivatives for Solar Cells", Journal of the American Chemical Society, American Chemical Society, US, vol. 130, No. 2, Jan. 1, 2008 (Jan. 1, 2008), pp. 732-742, XP002529842, ISSN: 0002-7863, [retrieved on Dec. 21, 2007].

Lei Ying et al: "Regioregular Pyridal[2,1,3]thiadiazole [pi]-Conjugated Copolymers", Journal of the America Chemical Society, vol. 133, No. 46, Nov. 23, 2011 (Nov. 23, 2011), pp. 18538-18541, XP055077696, ISSN: 0002-7863.

Ying Sun et al: "High-mobility low-bandgap conjugated copolymers based on indacenodithiophene and thiadiazolo [3,4-c]pyridine units for thin film transistor and photovoltaic applications", Journal of Materials Chemistry, vol. 21, No. 35, Jan. 1, 2011 (Jan. 1, 2011), pp. 13247, XP055198712, ISSN: 0959-9428.

Wen Wen et al: "Regioregular pyridyl[2,1,3]thiadiazole-co-indacenodithiophene conjugated polymers", Chemical Communications, vol. 49, No. 65, Jan. 1, 2013 (Jan. 1, 2013), pp. 7192, XP055198711, ISSN: 1359-7345.

Gregory C. Welch et al: "Lewis Acid Adducts of Narrow Band Gap Conjugated Polymers", Journal of the American Chemical Society, vol. 133, No. 12, Mar. 30, 2011 (Mar. 30, 2011), pp. 4632-4644, XP055021082, ISSN: 0002-7863.

Kiebooms R et al: "Synthesis, Electrical, and Optical Properties of Conjugated Polymers", Handbook of Advanced Electronic and Photonic Materials Anddevices, XX, XX, vol. 8, Jan. 1, 2001 (Jan. 1, 2001).

Yen-Ju Cheng et al: "Synthesis of Conjugated Polymers for Organic Solar Cell Applications", Chemical Reviews, vol. 109, No. 11, Nov. 11, 2009 (Nov. 11, 2009), pp. 5868-5923, XP055014184, ISSN: 0009-2665.

\* cited by examiner

THIADIAZOLOPYRIDINE POLYMERS, THEIR SYNTHESIS AND THEIR USE

TECHNICAL FIELD

The present invention relates to thiadiazolopyridine polymers, their synthesis and their use. The present invention further relates to organic electronic devices comprising such thiadiazolopyridine polymers.

BACKGROUND AND DESCRIPTION OF THE PRIOR ART

In recent years, organic semiconducting materials have been developed with the objective of producing more versatile, lower cost electronic devices. Organic semiconducting materials find their application in a wide range of devices and apparatus, including, for example, organic field effect transistors (OFETs), organic light emitting diodes (OLEDs), organic photodetectors (OPDs), organic photovoltaics (OPV), sensors, memory elements and logical circuits, to name just a few. Generally the organic semiconducting materials are present in such organic electronic devices in the form of a thin layer of, for example, a thickness of between 50 nm and 300 nm.

Organic photodetectors (OPDs) are one particular area of importance, for which conjugated light-absorbing polymers offer the hope of allowing efficient devices to be produced by solution-processing technologies, such as spin casting, dip coating or ink jet printing, to name a few only.

Despite significant progress it remains a challenge to provide polymers that show good and easy processability by solution-processing techniques, have sufficient solubility, have good stability and/or show high efficiency.

It is therefore an object of the present application to provide new organic semiconducting materials for use in organic electronic devices, particularly in organic photodetectors, said new organic semiconducting materials having advantageous properties. The new organic semiconducting materials may for example be characterized by one or more properties of the list consisting of good processability in solution-processing technologies, sufficient solubility, good stability and high efficiency, either taken singly or in any combination, also in combination with other advantages, which are immediately obvious to the skilled person on the basis of the following detailed description.

SUMMARY OF THE INVENTION

The present inventors have now surprisingly found that the above objects may be attained either individually or in any combination by the compound of the present application.

The present application therefore provides for a polymer comprising
(i) a first monomer unit $M^1$ of formula (I) in a first molar ratio $m_1$;

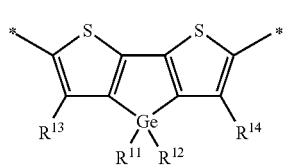

(I)

(ii) a second monomer unit $M^2$ of formula (II) in a second molar ratio $m_2$;

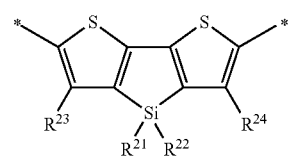

(II)

(iii) one or more third monomer units $M^3$, each being independently of each other selected from the group consisting of formula (III), formula (IV), formula (V), and formula (VI), in a third molar ratio $m_3$,

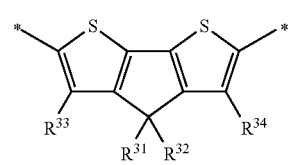

(III)

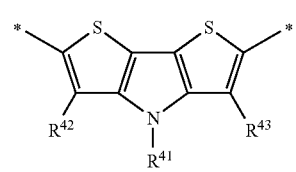

(IV)

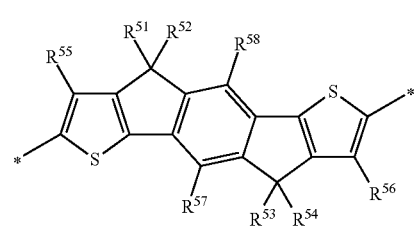

(V)

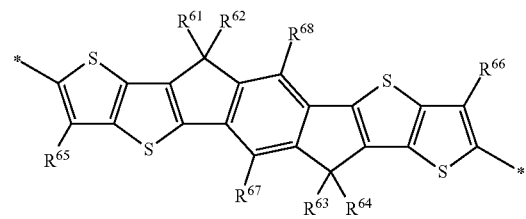

(VI)

(iv) one or more fourth monomer units $M^4$, each independently of the other, one or more electron donors comprising a group selected from the group consisting of aryl, heteroaryl, ethene-2,1-diyl (*—$(R^{81})C$=$C(R^{82})$—*) and ethyndiyl (*—C≡C—*), wherein such aryl or heteroaryl group is different from formulae (I) to (VI), in a fourth molar ratio $m_4$, and
(v) a fifth monomer unit $M^5$ of formula (VII) in a fifth molar ratio $m_5$,

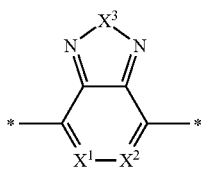

(VII)

wherein, independently at each occurrence, one of $X^1$ and $X^2$ is N and the other is C—$R^{71}$, and $X^3$ is at each occurrence independently selected from the group consisting of O, S, Te, Se and N—$R^{91}$, wherein the sum of first molar ratio $m_1$ and second molar ratio $m_2$ is at least 0.10 and at most 0.90, the third molar ratio $m_3$ is at least 0 and at most 0.80, the fourth molar ratio $m_4$ is at least 0 and at most 0.20, the fifth molar ratio $m_5$ is at least 0.10 and at most 0.90, and $m_1+m_2+m_3+m_4+m_5=1$, with the respective molar ratios $m_1$ to $m_5$ being relative to the total number of monomer units $M^1$ to $M^5$, and wherein, independently at each occurrence, $R^{11}$ to $R^{14}$, $R^{21}$ to $R^{24}$, $R^{31}$ to $R^{34}$, $R^{41}$ to $R^{43}$, $R^{51}$ to $R^{58}$, $R^{61}$ to $R^{68}$, $R^{71}$, $R^{81}$ to $R^{82}$ and $R^{91}$ are independently of each other H or a carbyl group.

The present application further relates to a mixture or a blend comprising one or more of said polymers and one or more compounds or polymers selected from the group consisting of binders and compounds or polymers having semiconducting, charge transport, hole transport, electron transport, hole blocking, electron blocking, electrically conducting, photoconducting or light emitting properties.

The present application also relates to a charge transport, semiconducting, electrically conducting, photoconducting or light emitting material comprising said polymer.

Additionally the present application relates to a component or device comprising said polymer, said component or device being selected from the group consisting of organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), organic solar cells (O-SC), photodiodes, laser diodes, photoconductors, organic photodetectors (OPD), electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences, preferably to an organic photodetector (OPD).

DETAILED DESCRIPTION OF THE INVENTION

Figure 1:
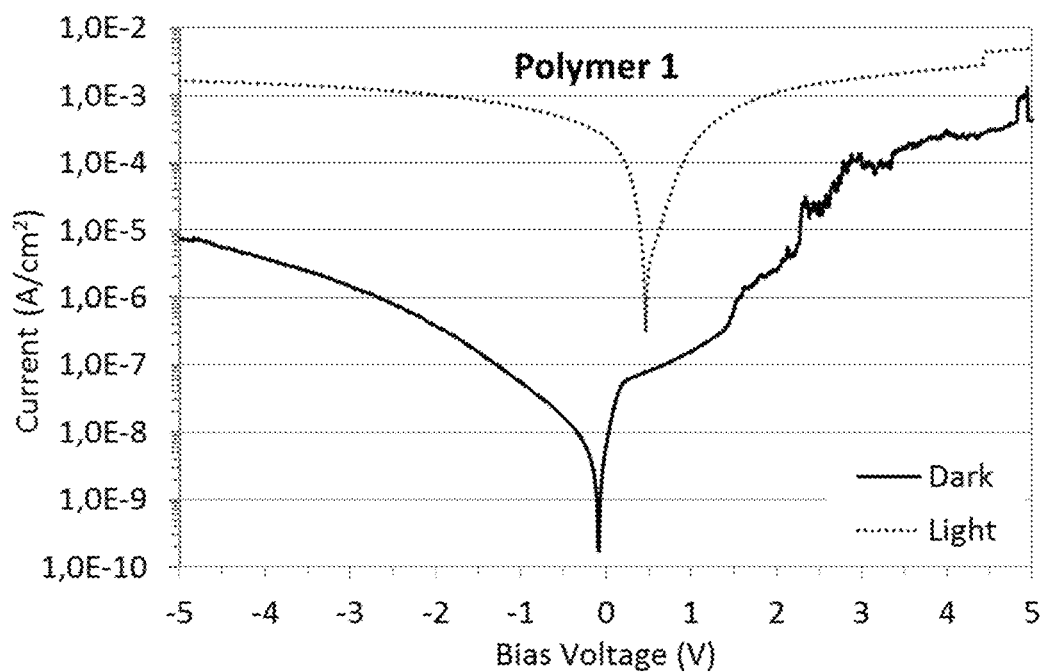
FIG. 1 shows a typical J-V curve for an OPD device comprising Polymer 1.

For the purposes of the present application an asterisk ("*") denotes a linkage to an adjacent unit or group or, in case of a polymer, to an adjacent repeating unit or any other group.

As used herein, unless stated otherwise the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1,2,4-trichlorobenzene. Unless stated otherwise, chlorobenzene is used as solvent. The molecular weight distribution ("MWD"), which may also be referred to as polydispersity index ("PDI"), of a polymer is defined as the ratio $M_w/M_n$. The degree of polymerization, also referred to as total number of repeat units, m, will be understood to mean the number average degree of polymerization given as $m=M_n/M_U$, wherein $M_n$ is the number average molecular weight of the polymer and $M_U$ is the molecular weight of the single repeat unit; see J. M. G. Cowie, *Polymers: Chemistry & Physics of Modern Materials*, Blackie, Glasgow, 1991.

For the purposes of the present application the term "organyl group" is used to denote any organic substituent group, regardless of functional type, having one free valence at a carbon atom.

For the purposes of the present application the term "organoheteryl group" is used to denote any univalent group comprising carbon, said group thus being organic, but having the free valence at an atom other than carbon.

For the purposes of the present application the term "carbyl group" includes both, organyl groups and organoheteryl groups.

In its basic form the present application is directed to a polymer comprising
(i) a first monomer unit $M^1$ in a first molar ratio $m_1$,
(ii) a second monomer unit $M^2$ in a second molar ratio $m_2$,
(iii) one or more third monomer $M^3$ units in a third molar ratio $m_3$,
(iv) one or more fourth monomer $M^4$ units in a fourth molar ratio $m_4$, and
(v) a fifth monomer unit $M^5$ in a fifth molar ratio $m_5$,
with the respective molar ratio $m_1$ to $m_5$ being relative to the total number of monomer units $M^1$ to $M^5$.

Preferably, the polymer of the present application comprises said monomer units in at least 50 wt % or 70 wt % or 90 wt %, even more preferably at least 95 wt % or 97 wt % or 99 wt %, still even more preferably at least 99.5 wt % or 99.7 wt % or 99.9 wt % of the total weight of said polymer, or the polymer may consist of said monomer units. In this context it is noted that the polymer of the present application may, in addition to said monomer units, also comprise other monomer units provided that these do not significantly change the overall properties of the present polymer.

The sum of first molar ratio $m_1$, second molar ratio $m_2$, third molar ratio $m_3$, fourth molar ratio $m_4$ and fifth molar ratio $m_5$ is 1.0, i.e. $m_1+m_2+m_3+m_4+m_5=1.0$.

The sum of first molar ratio $m_1$ and second molar ratio $m_2$ is at least 0.10 and at most 0.90, i.e. $0.10 \leq m_1+m_2 \leq 0.90$. Thus, the present polymer may comprise (i) monomer unit $M^1$ but no monomer unit $M^2$, (ii) monomer unit $M^2$ but no monomer unit $M^1$, or (iii) both, monomer unit $M^1$ and monomer unit $M^2$.

Preferably the first molar ratio $m_1$ is at least 0.10.

The third molar ratio $m_3$ is at least 0 and at most 0.80.

If $m_1=0$ or $m_2=0$ then $m_3$ is preferably at least 0.10 and at most 0.80, for example at most 0.79 or 0.75 or 0.74 or 0.70 or 0.69 or 0.65 or 0.64 or 0.60 or 0.59 or 0.55 or 0.54 or 0.50 or 0.49.

The fourth molar ratio $m_4$ is at least 0, preferably at least 0.01. The fourth molar ratio $m_4$ is at most 0.20, preferably at most 0.15 and most preferably at most 0.10.

The fifth molar ratio $m_5$ is at least 0.10, preferably at least 0.15, more preferably at least 0.20, even more preferably at least 0.25 and most preferably at least 0.30. The fifth molar ratio $m_5$ is at most 0.9, preferably at most 0.85, more preferably at most 0.80, even more preferably at most 0.75 and most preferably at most 0.70.

Preferably, for $m_3>0$ the ratio $(m_1+m_2)/m_3$ of the sum of first molar ratio $m_1$ and second molar ratio $m_2$ to third molar ratio $m_3$ is at least 1 and at most 100, for example at most 90 or at most 80 or at most 70 or at most 60 or at most 50 or at most 40 or at most 30 or at most 20 or at most 10.

The first monomer unit $M^1$ is of formula (I)

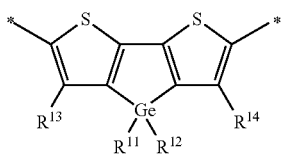

(I)

wherein $R^{11}$, $R^{12}$, $R^{13}$ and $R^{14}$ are as defined herein.

The second monomer unit $M^2$ is of formula (II)

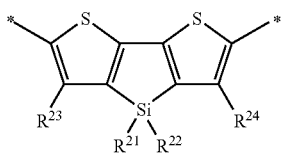

(II)

wherein $R^{21}$, $R^{22}$, $R^{26}$ and $R^{24}$ are as defined herein.

The one or more third monomer unit $M^3$ is at each occurrence independently of any other selected from the group consisting of formula (III), formula (IV), formula (V) and formula (VI)

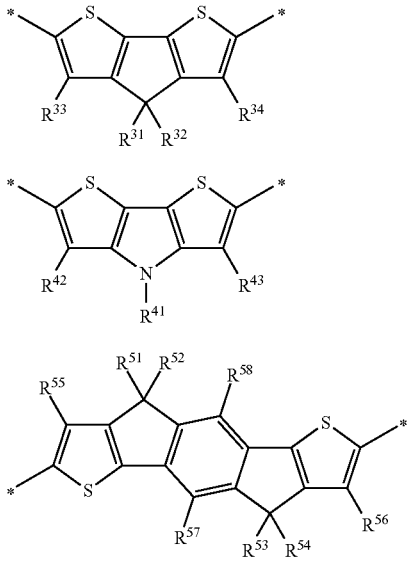

(III)

(IV)

(V)

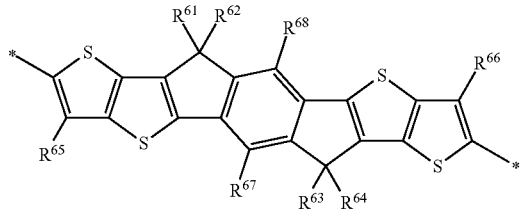

(VI)

wherein $R^{31}$ to $R^{34}$, $R^{41}$ to $R^{43}$, $R^{51}$ to $R^{58}$ and $R^{61}$ to $R^{68}$ are as defined herein.

The one or more fourth monomer unit $M^4$ is at each occurrence independently of each other one or more electron donors comprising a group selected from the group consisting of aryl, heteroaryl, ethene-2,1-diyl (*—$(R^{81})$C═C(R)—*) and ethyndiyl (*—C≡C—*), wherein such aryl or heteroaryl group is different from formulae (I) to (VI), and $R^{81}$ and $R^{82}$ are as defined herein. Aryl and heteroaryl are preferably as defined below.

Preferred examples of aryl and heteroaryl suitable for $M^4$ may at each occurrence independently selected from the group consisting of the following formulae (D1) to

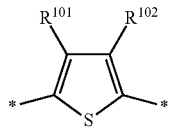

(D1)

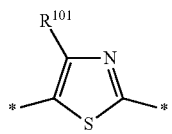

(D2)

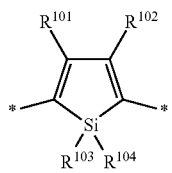

(D3)

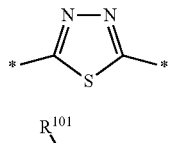

(D4)

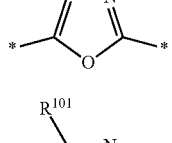

(D5)

(D6)

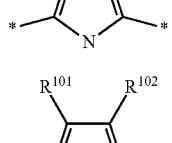

(D7)

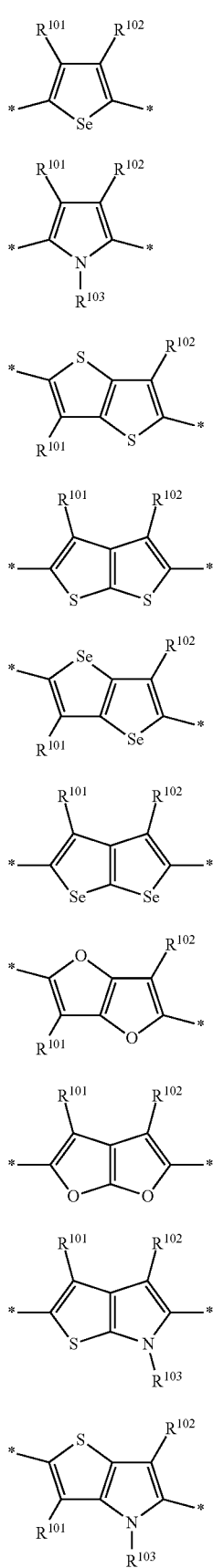
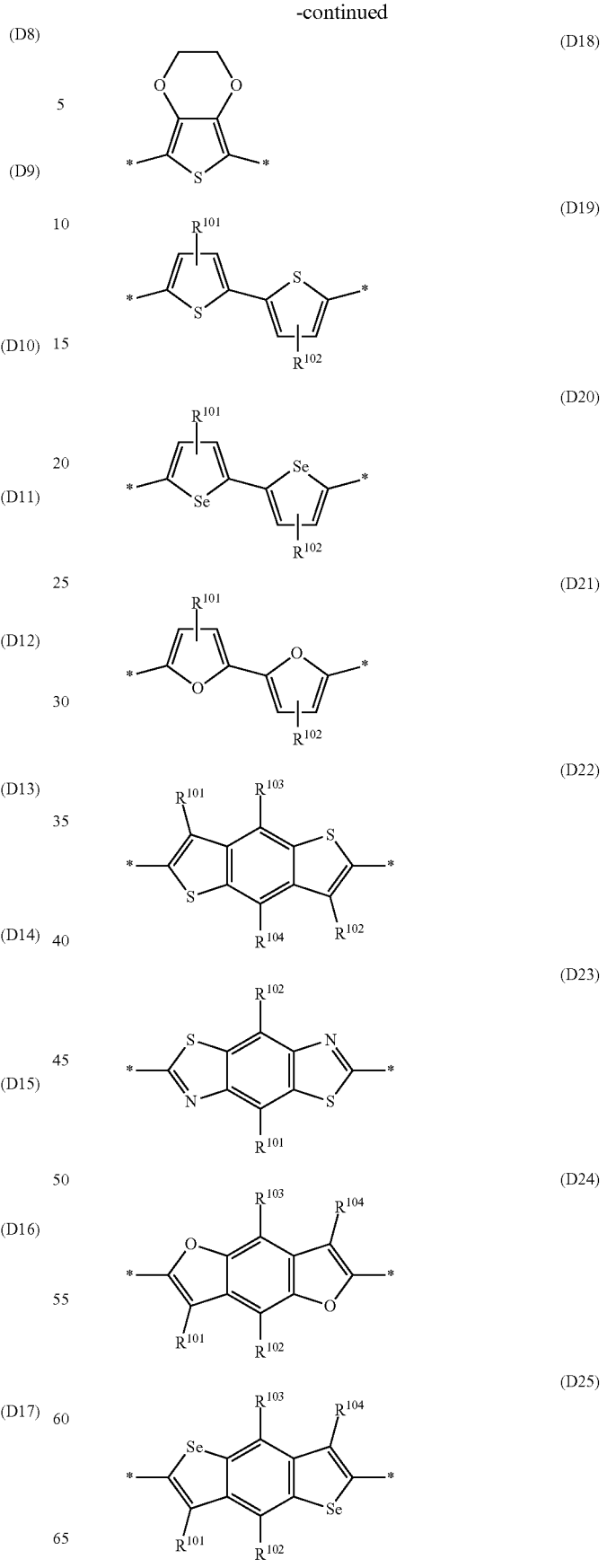

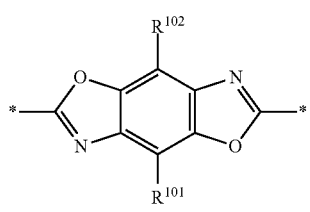
(D26)
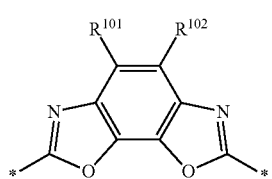
(D27)
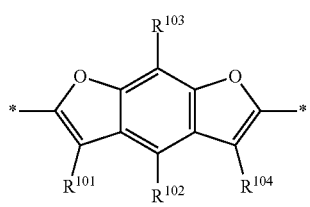
(D28)
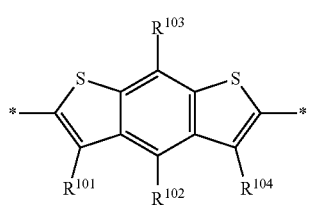
(D29)
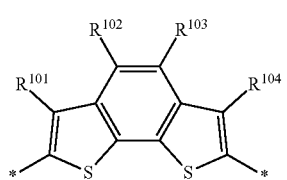
(D30)
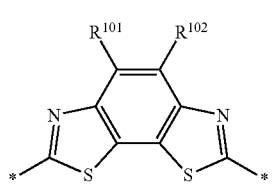
(D31)
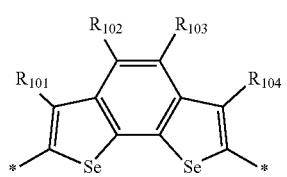
(D32)
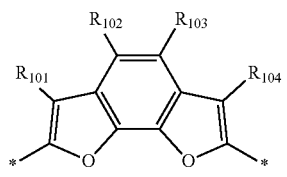
(D33)
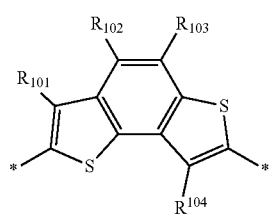
(D34)
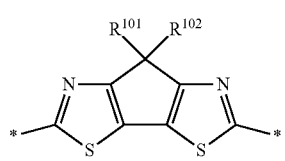
(D35)
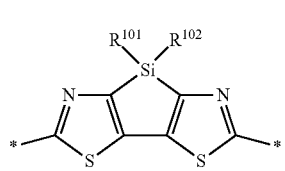
(D36)
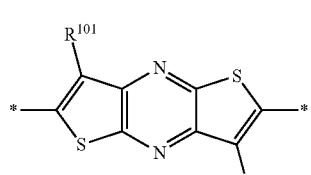
(D37)
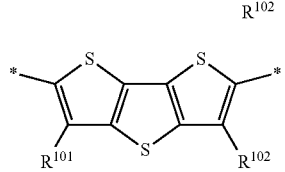
(D38)
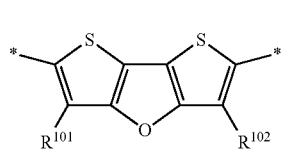
(D39)
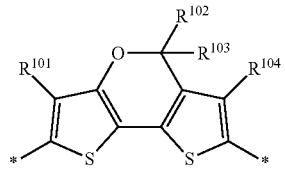
(D40)
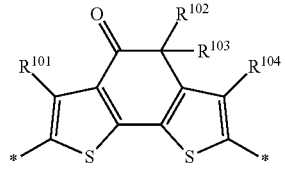
(D41)
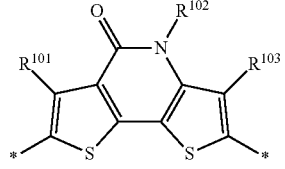
(D42)

-continued
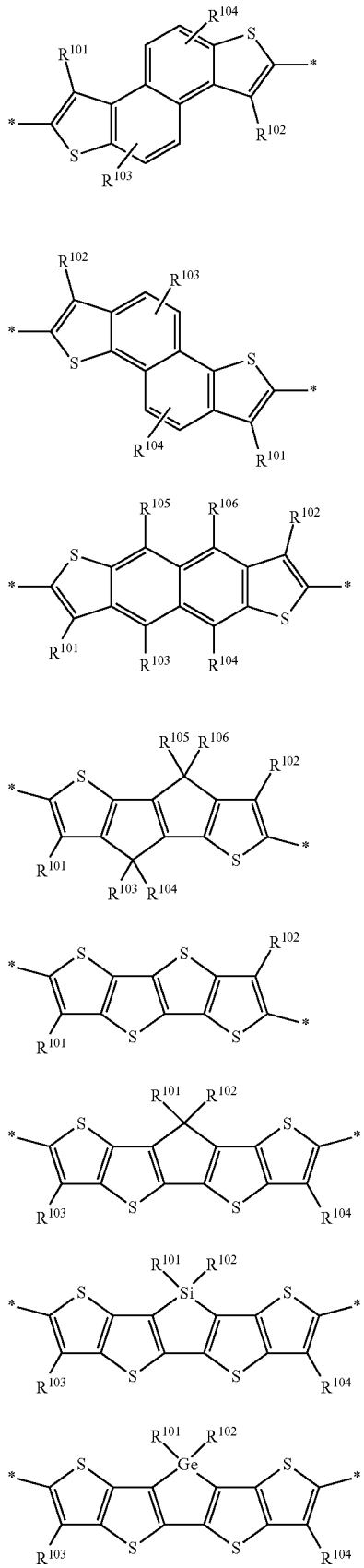
(D43)
(D44)
(D45)
(D46)
(D47)
(D48)
(D49)
(D50)
-continued
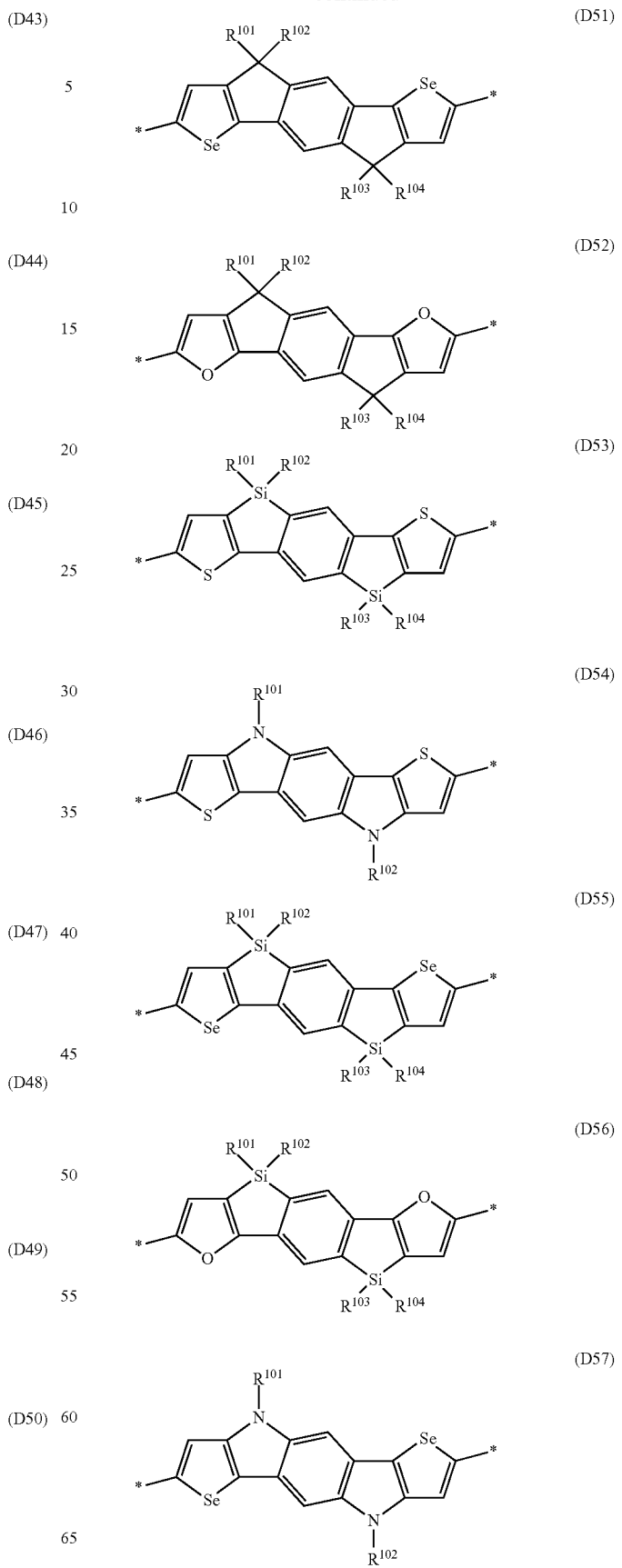
(D51)
(D52)
(D53)
(D54)
(D55)
(D56)
(D57)

-continued
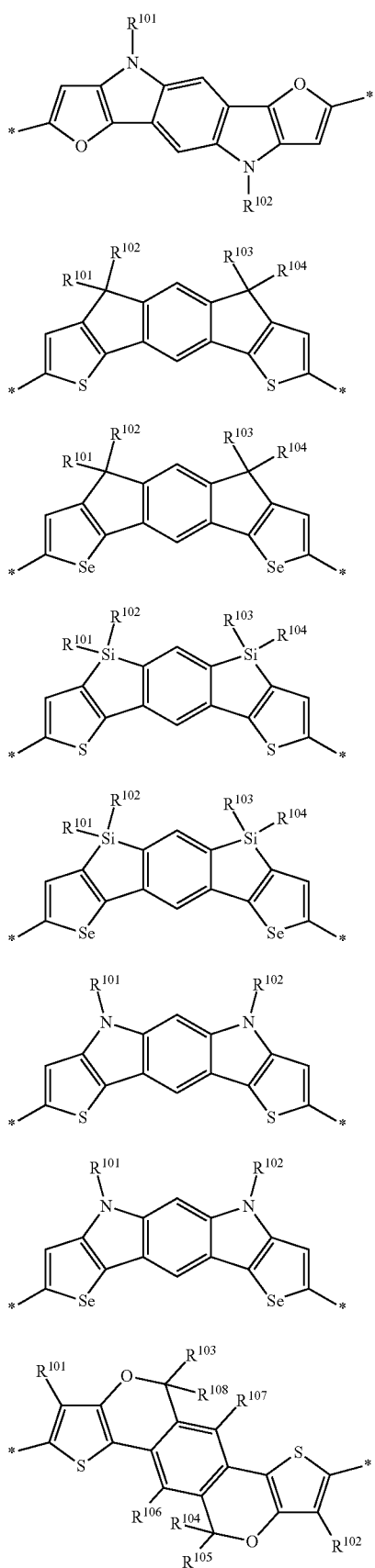
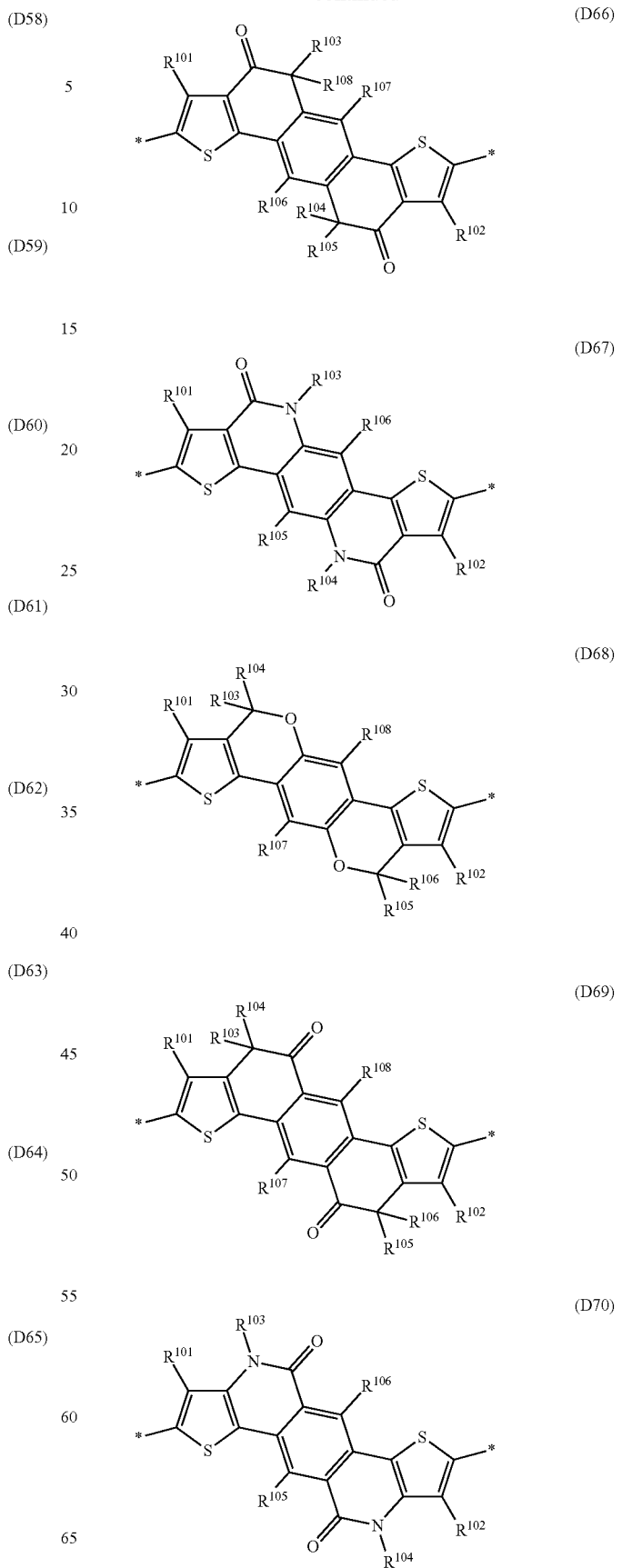

-continued
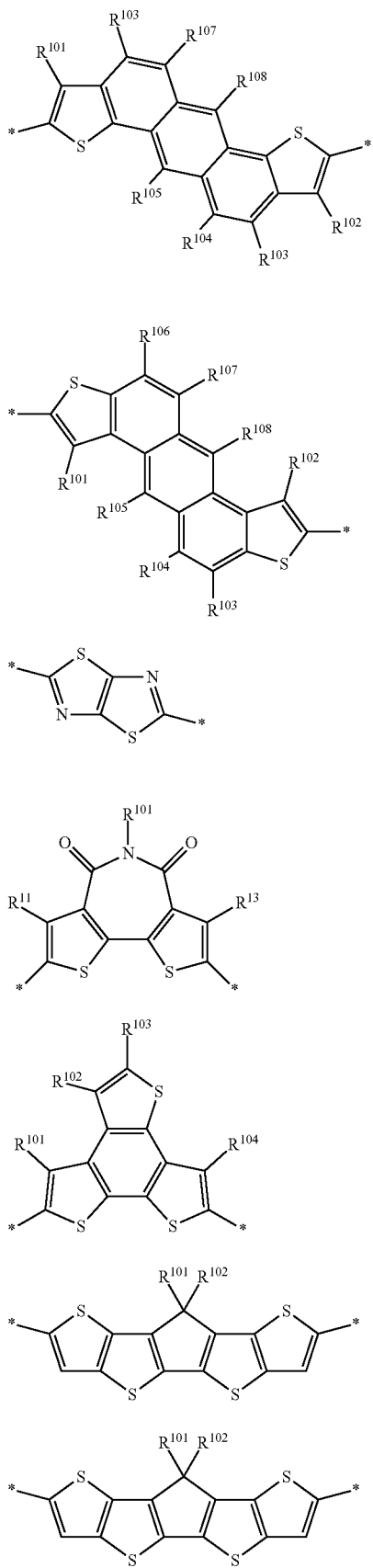
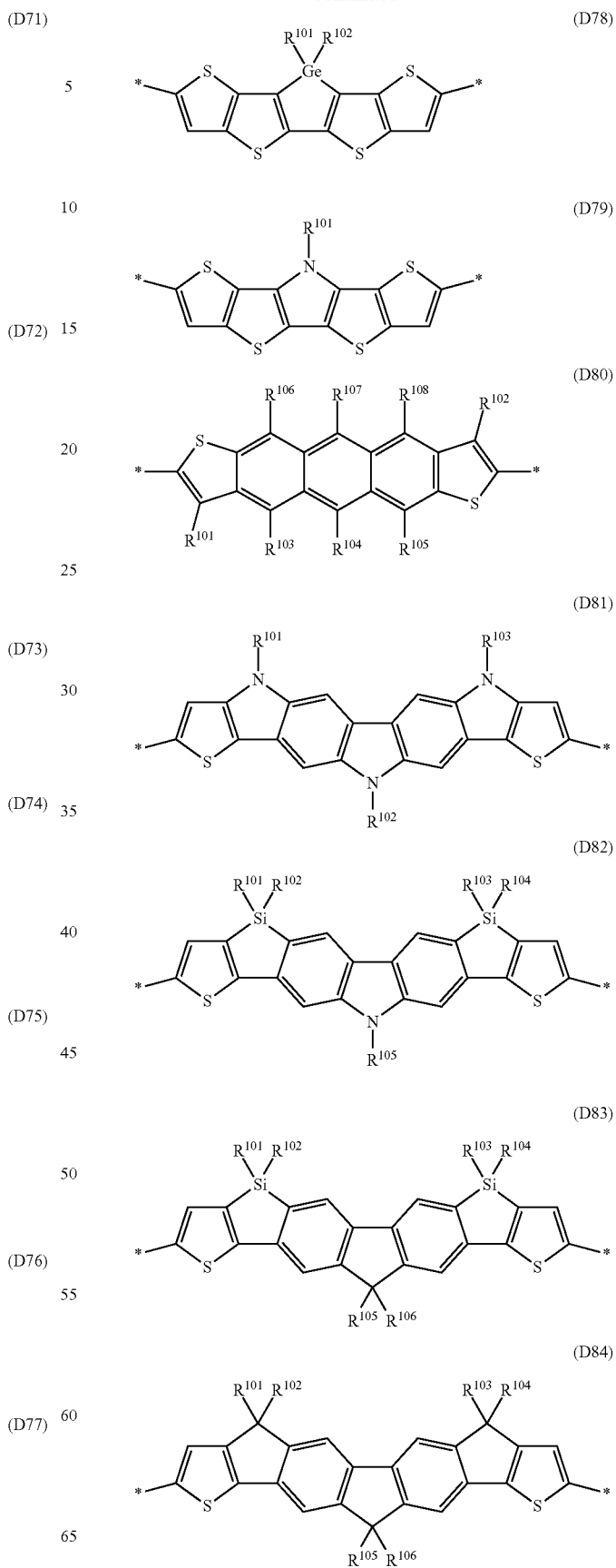

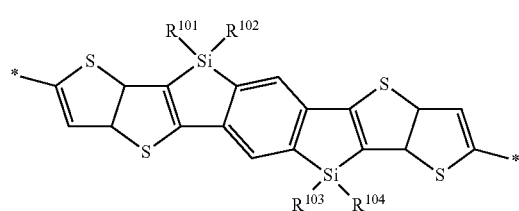
(D85)
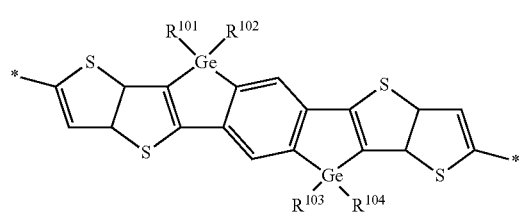
(D86)
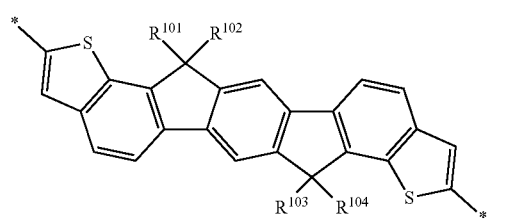
(D87)
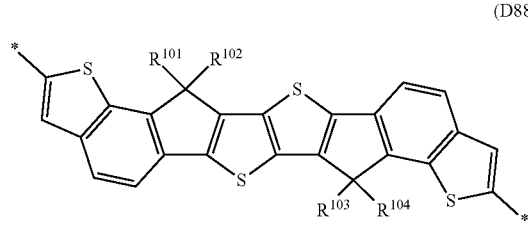
(D88)
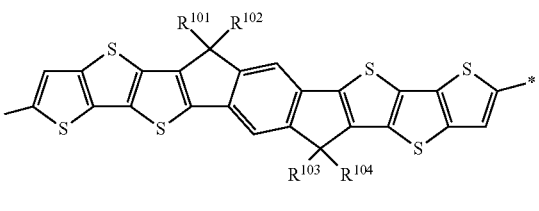
(D89)
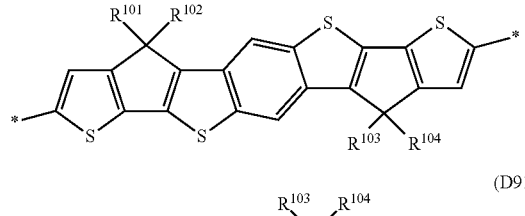
(D90)
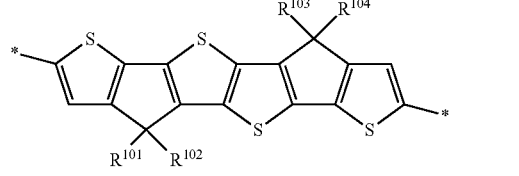
(D91)
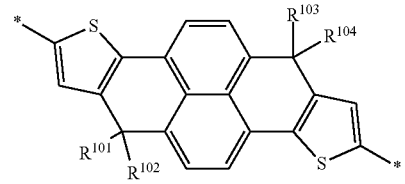
(D92)
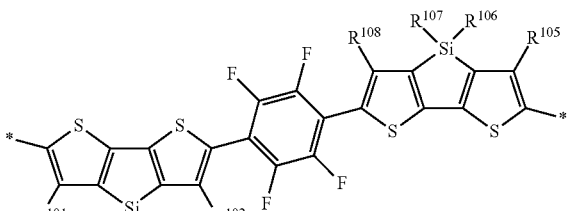
(D93)
(D94)
(D95)
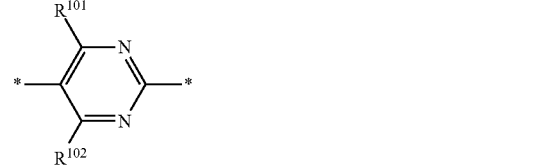
(D96)
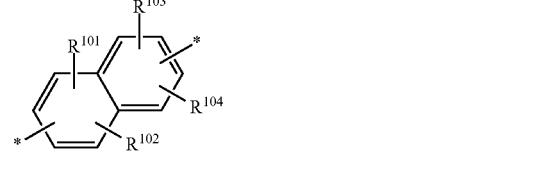
(D97)
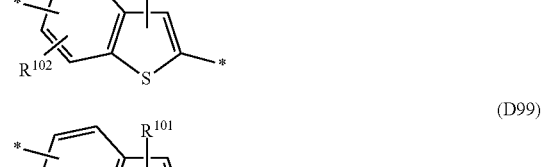
(D98)
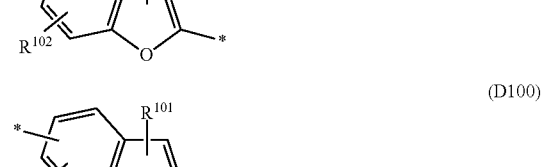
(D99)
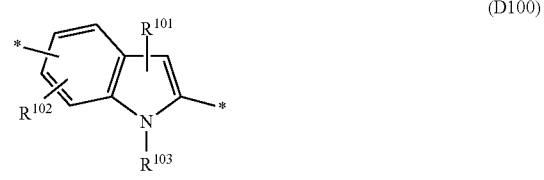
(D100)

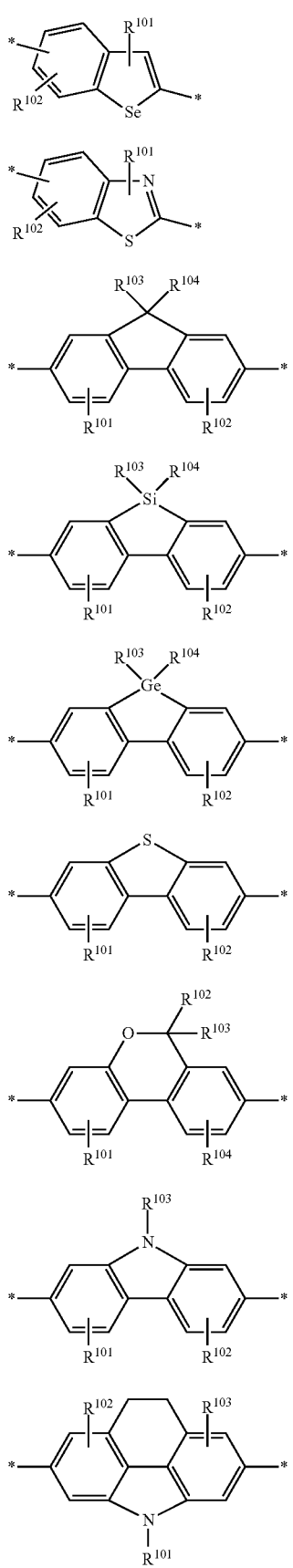
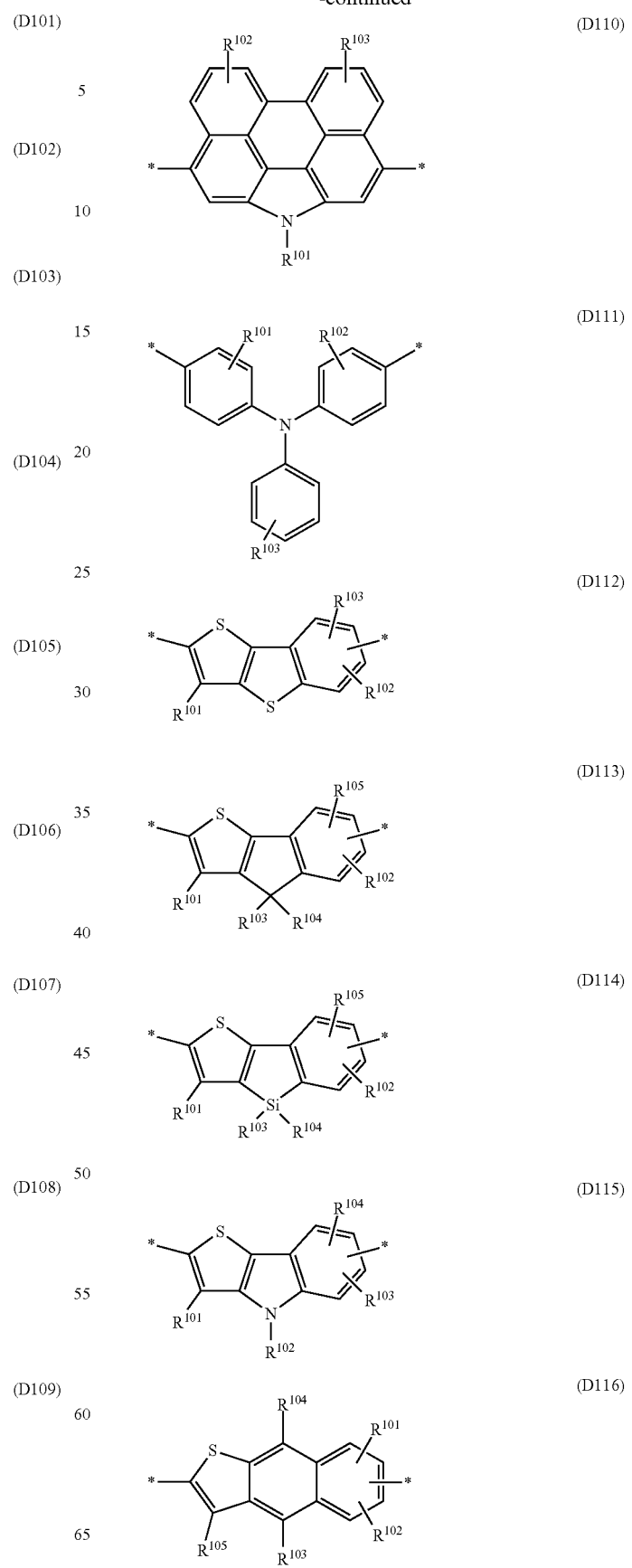

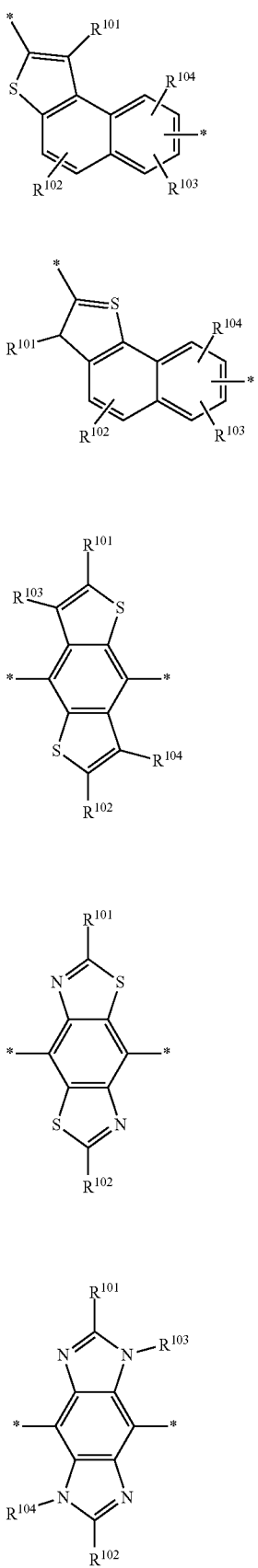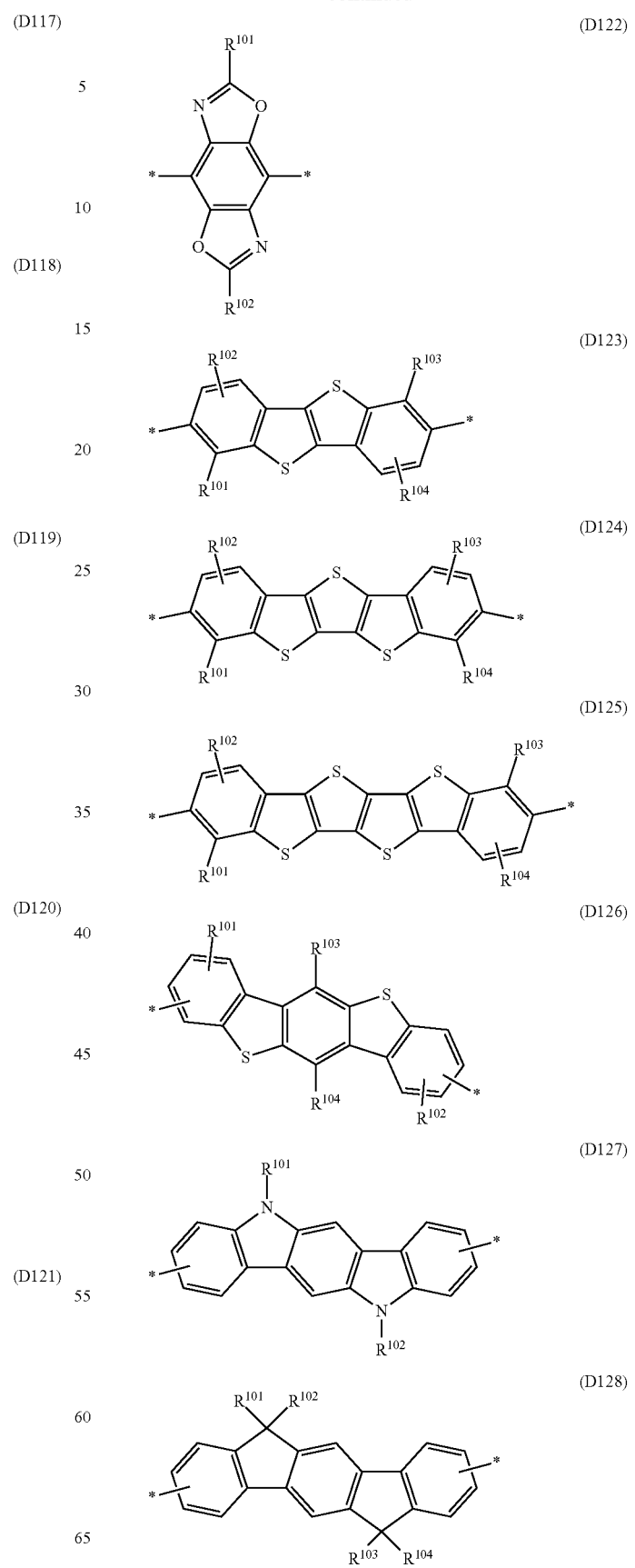

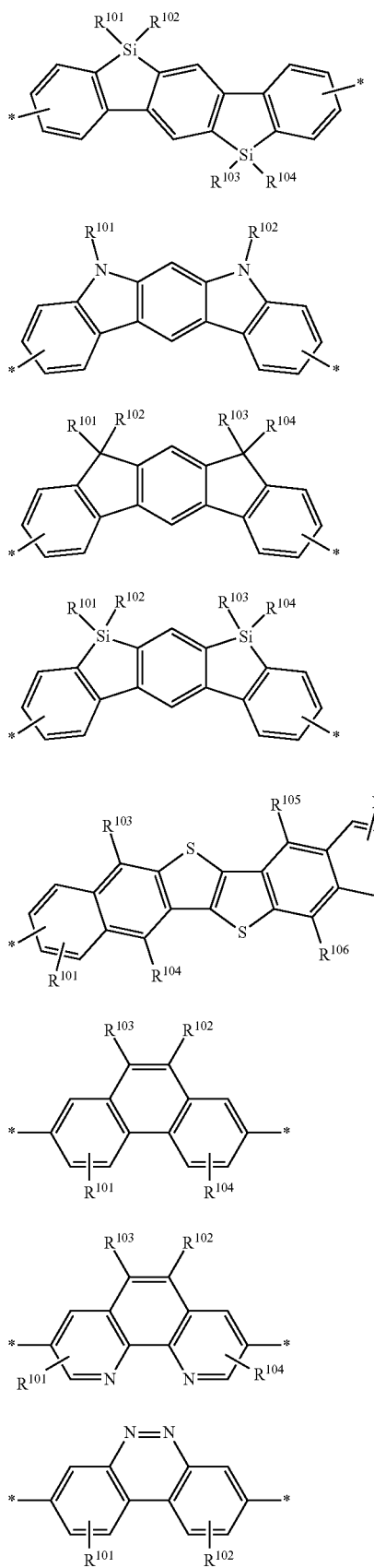

wherein $R^{101}$, $R^{102}$, $R^{103}$, $R^{104}$, $R^{105}$, $R^{106}$, $R^{107}$ and $R^{108}$ are independently of each other selected from the group consisting of H and $R^S$ as defined herein.

The fifth monomer unit $M^5$ is of formula (VII)

$$\text{(VII)}$$

wherein, independently at each occurrence, one of $X^1$ and $X^2$ is N and the other is C—$R^{71}$, with $X^3$ and $R^{71}$ as defined herein.

$X^3$ is at each occurrence independently selected from the group consisting of O, S, Te, Se and N—$R^{91}$, with $R^{91}$ as defined herein Preferably $X^3$ is at each occurrence independently selected from the group consisting of O, S and Se. More preferably $X^3$ is at each occurrence independently S or O. Most preferably $X^3$ is S.

Generally stated the monomer units of formula (VII) may be arranged either regio-regularly or regio-irregularly along the polymer backbone. For the purposes of the present application it is, however, preferred that the monomer units of formula (VII) are arranged regio-irregularly along the polymer backbone.

When regio-regularly along the polymer backbone, the monomer units of formula (VII) may either be inserted into the polymer backbone in an alternating manner or in a non-alternating manner. For the purposes of the present application, the term "in a non-alternating manner" is to denote that at least 95%, for example at least 96% or 98% or 99.0% or 99.5% or 99.7% or 99.9%, of the monomer units of formula (VII) have been inserted into the polymer backbone by 4,7-insertion or that at least 95%, for example at least 96% or 98% or 99.0% or 99.5% or 99.7% or 99.9%, of the monomer units of formula (VII) have been inserted into the polymer backbone by 7,4-insertion. For the purposes of the present application, the term "in an alternating manner" is to denote that subsequent monomer units of formula (VII) are inserted into the polymer backbone in such a way that a 4,7-inserted monomer unit is followed by a 7,4-inserted monomer unit and vice versa, i.e. a 7,4-inserted monomer unit followed by a 4,7-inserted monomer unit.

For the purposes of the present application the term "regio-irregular" is to denote that the monomer units of formula (VII) are arranged in a random manner along the polymer backbone, i.e. the monomer units of formula (VII) are inserted into the polymer backbone randomly by 4,7-insertion and 7,4-insertion.

$R^{11}$ to $R^{14}$, $R^{21}$ to $R^{24}$, $R^{31}$ to $R^{34}$, $R^{41}$ to $R^{43}$, $R^{51}$ to $R^{58}$, $R^{61}$ to $R^{68}$, $R^{71}$, $R^{81}$ to $R^{82}$ and $R^{91}$ are at each occurrence independently of each other selected from the group consisting of H and $R^S$.

$R^S$ is at each occurrence independently a carbyl group as defined herein and preferably selected from the group consisting of any group $R^T$ as defined herein, hydrocarbyl having from 1 to 40 carbon atoms wherein the hydrocarbyl may be further substituted with one or more groups $R^T$, and hydrocarbyl having from 1 to 40 carbon atoms comprising one or more heteroatoms selected from the group consisting of N, O, S, P, Si, Se, As, Te or Ge, with N, O and S being preferred heteroatoms, wherein the hydrocarbyl may be further substituted with one or more groups $R^T$.

Preferred examples of hydrocarbyl suitable as $R^S$ may at each occurrence be independently selected from phenyl, phenyl substituted with one or more groups $R^T$, alkyl and alkyl substituted with one or more groups $R^T$, wherein the alkyl has at least 1, preferably at least 5 and has at most 40, more preferably at most 30 or 25 or 20, even more preferably at most 15 and most preferably at most 12 carbon atoms. It is noted that for example alkyl suitable as $R^S$ also includes fluorinated alkyl, i.e. alkyl wherein one or more hydrogen is replaced by fluorine, and perfluorinated alkyl, i.e. alkyl wherein all of the hydrogen are replaced by fluorine.

$R^T$ is at each occurrence independently selected from the group consisting of F, Br, Cl, —CN, —NC, —NCO, —NCS, —OCN, —SCN, —C(O)NR$^O$R$^{OO}$, —C(O)X$^O$, —C(O)R$^O$, —NH$_2$, —NR$^O$R$^{OO}$, —SH, —SR$^O$, —SO$_3$H, —SO$_2$R$^O$, —OH, —OR$^O$, —NO$_2$, —SF$_5$ and —SiR$^O$R$^{OO}$R$^{OOO}$. Preferred $R^T$ are selected from the group consisting of F, Br, Cl, —CN, —NC, —NCO, —NCS, —OCN, —SCN, —C(O)NR$^O$R$^{OO}$, —C(O)X$^O$, —C(O)R$^O$, —NH$_2$, —NR$^O$R$^{OO}$, —SH, —SR$^O$, —OH, —OR$^O$ and —SiR$^O$R$^{OO}$R$^{OOO}$. Most preferred $R^T$ is F.

$R^O$, $R^{OO}$ and $R^{OOO}$ are at each occurrence independently of each other selected from the group consisting of H, F and hydrocarbyl having from 1 to 40 carbon atoms. Said hydrocarbyl preferably has at least 5 carbon atoms. Said hydrocarbyl preferably has at most 30, more preferably at most 25 or 20, even more preferably at most 20, and most preferably at most 12 carbon atoms. Preferably, $R^O$, $R^{OO}$ and $R^{OOO}$ are at each occurrence independently of each other selected from the group consisting of H, F, alkyl, fluorinated alkyl, alkenyl, alkynyl, phenyl and fluorinated phenyl. More preferably, $R^O$, $R^{OO}$ and $R^{OOO}$ are at each occurrence independently of each other selected from the group consisting of H, F, alkyl, fluorinated, preferably perfluorinated, alkyl, phenyl and fluorinated, preferably perfluorinated, phenyl.

It is noted that for example alkyl suitable as $R^O$, $R^{OO}$ and $R^{OOO}$ also includes perfluorinated alkyl, i.e. alkyl wherein all of the hydrogen are replaced by fluorine. Examples of suitable alkyls may be selected from the group consisting of methyl, ethyl, n-propyl, iso-propyl, n-butyl, iso-butyl, tert-butyl (or "t-butyl"), pentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl (—C$_{20}$H$_{41}$).

$X^O$ is halogen. Preferably $X^O$ is selected from the group consisting of F, Cl and Br.

A hydrocarbyl group comprising a chain of 3 or more carbon atoms and heteroatoms combined may be straight chain, branched and/or cyclic, including spiro and/or fused rings.

Hydrocarbyl suitable as $R^S$, $R^O$, $R^{OO}$ and/or $R^{OOO}$ may be saturated or unsaturated. Examples of saturated hydrocarbyl include alkyl. Examples of unsaturated hydrocarbyl may be selected from the group consisting of alkenyl (including acyclic and cyclic alkenyl), alkynyl, allyl, alkyldienyl, polyenyl, aryl and heteroaryl.

Preferred hydrocarbyl suitable as $R^S$, $R^O$, $R^{OO}$ and/or $R^{OOO}$ include hydrocarbyl comprising one or more heteroatoms and may for example be selected from the group consisting of alkoxy, alkylcarbonyl, alkoxycarbonyl, alkylcarbonyloxy and alkoxycarbonyloxy, alkylaryloxy, arylcarbonyl, aryloxycarbonyl, arylcarbonyloxy and aryloxycarbonyloxy.

Preferred examples of aryl and heteroaryl comprise mono-, bi- or tricyclic aromatic or heteroaromatic groups that may also comprise condensed rings.

Especially preferred aryl and heteroaryl groups may be selected from the group consisting of phenyl, phenyl wherein one or more CH groups are replaced by N, naphthalene, fluorene, thiophene, pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, dithienothiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole and benzothiadiazole.

Preferred examples of an alkoxy group, i.e. a corresponding alkyl group wherein the terminal CH$_2$ group is replaced by —O—, can be straight-chain or branched, preferably straight-chain (or linear). Suitable examples of such alkoxy group may be selected from the group consisting of methoxy, ethoxy, propoxy, butoxy, pentoxy, hexoxy, heptoxy, octoxy, nonoxy, decoxy, undecoxy, dodecoxy, tridecoxy, tetradecoxy, pentadecoxy, hexadecoxy, heptadecoxy and octadecoxy.

Preferred examples of alkenyl, i.e. a corresponding alkyl wherein two adjacent CH$_2$ groups are replaced by —CH═CH— can be straight-chain or branched. It is preferably straight-chain. Said alkenyl preferably has 2 to 10 carbon atoms. Preferred examples of alkenyl may be selected from the group consisting of vinyl, prop-1-enyl, or prop-2-enyl, but-1-enyl, but-2-enyl or but-3-enyl, pent-1-enyl, pent-2-enyl, pent-3-enyl or pent-4-enyl, hex-1-enyl, hex-2-enyl, hex-3-enyl, hex-4-enyl or hex-5-enyl, hept-1-enyl, hept-2-enyl, hept-3-enyl, hept-4-enyl, hept-5-enyl or hept-6-enyl, oct-1-enyl, oct-2-enyl, oct-3-enyl, oct-4-enyl, oct-5-enyl, oct-6-enyl or oct-7-enyl, non-1-enyl, non-2-enyl, non-3-enyl, non-4-enyl, non-5-enyl, non-6-enyl, non-7-enyl, non-8-enyl, dec-1-enyl, dec-2-enyl, dec-3-enyl, dec-4-enyl, dec-5-enyl, dec-6-enyl, dec-7-enyl, dec-8-enyl and dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples of particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Alkenyl groups having up to 5 C atoms are generally preferred.

Preferred examples of oxaalkyl, i.e. a corresponding alkyl wherein one non-terminal $CH_2$ group is replaced by —O—, can be straight-chain or branched, preferably straight chain. Specific examples of oxaalkyl may be selected from the group consisting of 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl and 2-, 3-, 4-, 5-, 6-, 7-, 8- or 9-oxadecyl.

Preferred examples of carbonyloxy and oxycarbonyl, i.e. a corresponding alkyl wherein one $CH_2$ group is replaced by —O— and one of the thereto adjacent $CH_2$ groups is replaced by —C(O)—, may be selected from the group consisting of acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxycarbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, and 4-(methoxycarbonyl)-butyl.

Preferred examples of thioalkyl, i.e where one $CH_2$ group is replaced by —S—, may be straight-chain or branched, preferably straight-chain. Suitable examples may be selected from the group consisting of thiomethyl (—$SCH_3$), 1-thioethyl (—$SCH_2CH_3$), 1-thiopropyl (—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) and 1-(thiododecyl).

A fluoroalkyl group is preferably perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, in particular 1,1-difluoroalkyl, all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, 2-butyloctyl, 2-hexyldecyl, 2-octyldodecyl, 7-decylnonadecyl, in particular 2-methylbutyl, 2-methylbutoxy, 2-methylpentoxy, 3-methylpentoxy, 2-ethyl-hexoxy, 1-methylhexoxy, 2-octyloxy, 2-oxa-3-methylbutyl, 3-oxa-4-methylpentyl, 4-methylhexyl, 2-butyloctyl, 2-hexyldecyl, 2-octyldodecyl, 7-decylnonadecyl, 3,8-dimethyloctyl, 2-hexyl, 2-octyl, 2-nonyl, 2-decyl, 2-dodecyl, 6-meth-oxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloropropionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Most preferred is 2-ethylhexyl.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the organyl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

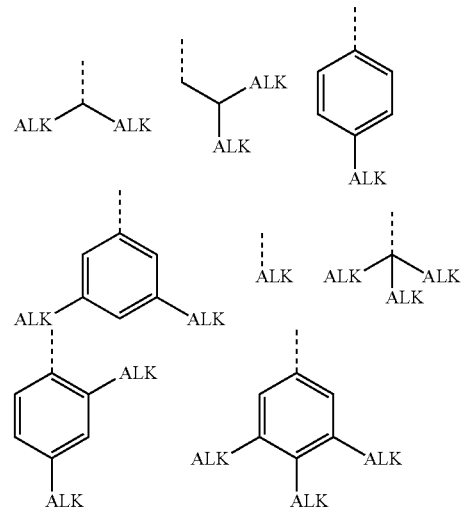

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

Preferably, $R^{11}$ to $R^{14}$, $R^{21}$ to $R^{24}$, $R^{31}$ to $R^{34}$, $R^{41}$ to $R^{43}$, $R^{51}$ to $R^{58}$, $R^{61}$ to $R^{68}$, $R^{71}$, $R^{81}$ to $R^{82}$ and $R^{91}$ are at each occurrence independently of each other selected from the group consisting of H, alkyl, alkyl wherein the hydrogen atoms are partially or completely replaced by fluorine atoms, phenyl, phenyl substituted with alkyl, phenyl substituted with alkyl having from 1 to 40 carbon atoms wherein the hydrogen atoms are partially or completely replaced by fluorine atoms, and phenyl wherein the hydrogen atoms are partially or completely replaced with fluorine atoms.

More preferably $R^{11}$ to $R^{14}$, $R^{21}$ to $R^{24}$, $R^{31}$ to $R^{34}$, $R^{41}$ to $R^{43}$, $R^{51}$ to $R^{58}$, $R^{61}$ to $R^{68}$, $R^{71}$, $R^{81}$ to $R^{82}$ and $R^{91}$ are at each occurrence independently of each other selected from the group consisting of H, alkyl having from 1 to 40 (or from 5 to 30 or from 5 to 20) carbon atoms, phenyl, and phenyl substituted with alkyl having from 1 to 40 carbon atoms (or from 5 to 30 or from 5 to 20).

Most preferably $R^{11}$, $R^{12}$, $R^{21}$, $R^{22}$, $R^{31}$, $R^{32}$, and $R^{41}$ are independently of each other selected from alkyl having at least 1 or at least 5 carbon atoms and at most 40 (for example, 35 or 30 or 25 or 20 or 15 or 10) carbon atoms. A particularly suitable alkyl is *—$CH_2$—$CH(CH_2$—$CH_3)$—$CH_2CH_2$—$CH_2$—$CH_3$.

Most preferably $R^{51}$, $R^{52}$, $R^{53}$, $R^{54}$, $R^{61}$, $R^{62}$, $R^{63}$ and $R^{64}$ are at each occurrence independently of each other selected from phenyl or phenyl substituted with alkyl having from 1 to 40 carbon atoms. A particularly suitable phenyl substituted with alkyl is

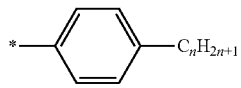

with n being preferably at least 1 (for example, at least 5 or 10 or 15) and at most 40 (for example, at most 35 or 30 or 25 or 20).

Most preferably $R^{71}$ is H.

Preferably the polymers of the present application comprise the respective monomer units in form of sequence units as defined in the following. It is preferred that at least 50% or 70% or 90%, even more preferably at least 95% or 97% or 99%, still even more preferably at least 99.5% or 99.7% or 99.9% and most preferably all of the monomer units, which are comprised in the polymer, are comprised in a sequence unit, wherein the respective monomer unit selected from the group consisting of $M^1$, $M^2$, $M^3$ and $M^4$—if present—is adjacent to at least one monomer unit of formula (VII).

For the polymer of the present application it is preferred that at least 50% or 70% or 90%, even more preferably at least 95% or 97% or 99%, still even more preferably at least 99.5% or 99.7% or 99.9% and most preferably all of the first monomer units $M^1$, which are comprised in the polymer, are comprised in a first sequence unit $S^1$, wherein a first monomer unit $M^1$ is adjacent to at least one monomer unit of formula (VII).

An exemplary first sequence unit $S^1$ is of formula (S-I)

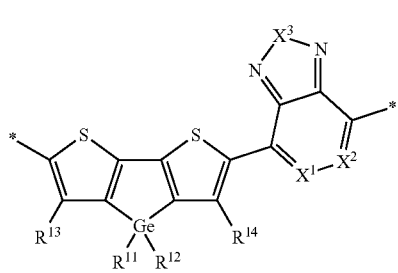

wherein $R^{11}$, $R^{12}$, $R^{13}$, $R^{14}$, $X^1$, $X^2$ and $X^3$ are as defined herein.

For the polymer of the present application it is preferred that at least 50% or 70% or 90%, even more preferably at least 95% or 97% or 99%, still even more preferably at least 99.5% or 99.7% or 99.9% and most preferably all of the second monomer units $M^2$, which are comprised in the polymer, are comprised in a second sequence unit $S^2$, wherein a second monomer unit $M^2$ is adjacent to at least one monomer unit of formula (VII).

An exemplary second sequence unit $S^2$ is of formula (S-II)

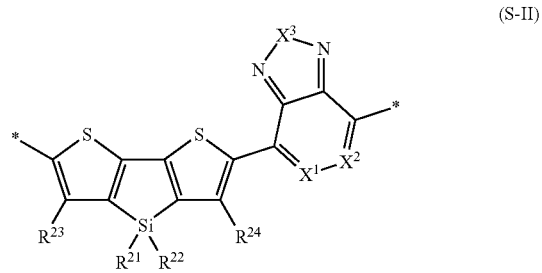

wherein $R^{21}$, $R^{22}$, $R^{23}$, $R^{24}$, $X^1$, $X^2$ and $X^3$ are as defined herein.

For the polymer of the present application it is preferred that at least 50% or 70% or 90%, even more preferably at least 95% or 97% or 99%, still even more preferably at least 99.5% or 99.7% or 99.9% and most preferably all of the third monomer units $M^3$, which are comprised in the polymer, are comprised in a third sequence unit $S^3$, wherein a third monomer unit $M^3$ is adjacent to at least one monomer unit of formula (VII).

Exemplary third sequence units $S^3$ may at each occurrence independently be selected from the group consisting of formula (S-III), formula (S-IV), formula (S-V) and formula (S-VI)

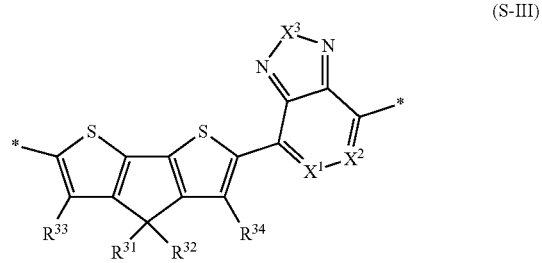

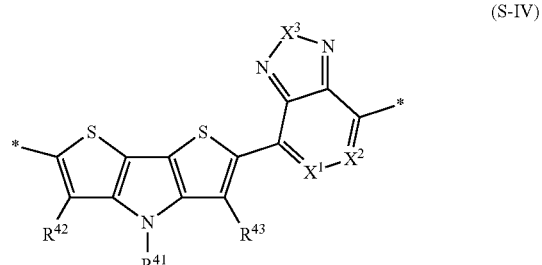

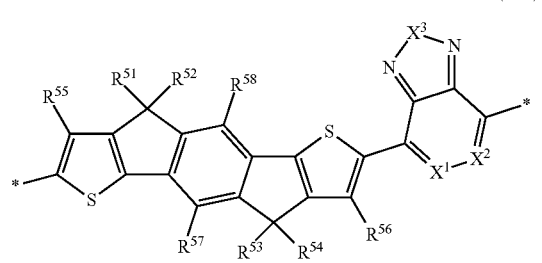

-continued (S-VI)

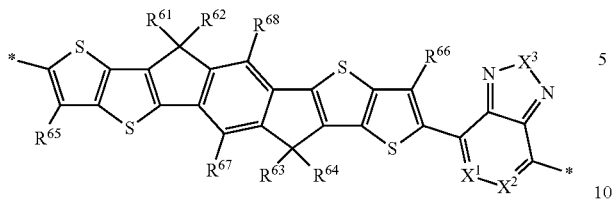

wherein $R^{31}$ to $R^{34}$, $R^{41}$ to $R^{43}$, $R^{51}$ to $R^{58}$ and $R^{61}$ to $R^{68}$, $X^1$, $X^2$ and $X^3$ are as defined herein.

For the polymer of the present application it is preferred that at least 50% or 70% or 90%, even more preferably at least 95% or 97% or 99%, still even more preferably at least 99.5% or 99.7% or 99.9% and most preferably all of the fourth monomer units $M^4$, which are comprised in the polymer, are comprised in a fourth sequence unit $S^4$, wherein a fourth monomer unit $M^4$ is adjacent to at least one monomer unit of formula (VII).

Exemplary fourth sequence units $S^4$ may at each occurrence independently be of formula (S-VII)

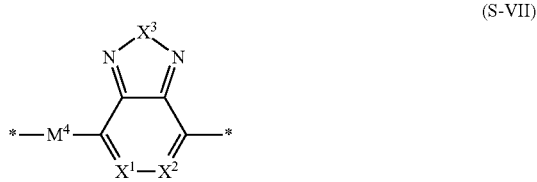

(S-VII)

wherein, independently at each occurrence, one of $X^1$ and $X^2$ is N and the other is C—$R^{71}$, with $X^3$ and $R^{71}$ as defined herein, and wherein, independently at each occurrence, $M^4$ is as defined herein.

Preferred examples of suitable sequence units may also be selected from the group consisting of formulae (S-VIII-01) to (S-VIII-24)

| | |
|---|---|
| -$M^1$-$M^5$-$M^2$-$M^5$-$M^3$-$M^5$-$M^4$-$M^5$- | (S-VIII-01) |
| -$M^1$-$M^5$-$M^2$-$M^5$-$M^4$-$M^5$-$M^3$-$M^5$- | (S-VIII-02) |
| -$M^1$-$M^5$-$M^3$-$M^5$-$M^2$-$M^5$-$M^4$-$M^5$- | (S-VIII-03) |
| -$M^1$-$M^5$-$M^3$-$M^5$-$M^4$-$M^5$-$M^2$-$M^5$- | (S-VIII-04) |
| -$M^1$-$M^5$-$M^4$-$M^5$-$M^2$-$M^5$-$M^3$-$M^5$- | (S-VIII-05) |
| -$M^1$-$M^5$-$M^4$-$M^5$-$M^3$-$M^5$-$M^2$-$M^5$- | (S-VIII-06) |
| -$M^2$-$M^5$-$M^1$-$M^5$-$M^3$-$M^5$-$M^4$-$M^5$- | (S-VIII-07) |
| -$M^2$-$M^5$-$M^1$-$M^5$-$M^4$-$M^5$-$M^3$-$M^5$- | (S-VIII-08) |
| -$M^2$-$M^5$-$M^3$-$M^5$-$M^1$-$M^5$-$M^4$-$M^5$- | (S-VIII-09) |
| -$M^2$-$M^5$-$M^3$-$M^5$-$M^4$-$M^5$-$M^1$-$M^5$- | (S-VIII-10) |
| -$M^2$-$M^5$-$M^4$-$M^5$-$M^1$-$M^5$-$M^3$-$M^5$- | (S-VIII-11) |
| -$M^2$-$M^5$-$M^4$-$M^5$-$M^3$-$M^5$-$M^1$-$M^5$- | (S-VIII-12) |
| -$M^3$-$M^5$-$M^1$-$M^5$-$M^2$-$M^5$-$M^4$-$M^5$- | (S-VIII-13) |
| -$M^3$-$M^5$-$M^1$-$M^5$-$M^4$-$M^5$-$M^2$-$M^5$- | (S-VIII-14) |
| -$M^3$-$M^5$-$M^2$-$M^5$-$M^1$-$M^5$-$M^4$-$M^5$- | (S-VIII-15) |
| -$M^3$-$M^5$-$M^2$-$M^5$-$M^4$-$M^5$-$M^1$-$M^5$- | (S-VIII-16) |
| -$M^3$-$M^5$-$M^4$-$M^5$-$M^1$-$M^5$-$M^2$-$M^5$- | (S-VIII-17) |
| -$M^3$-$M^5$-$M^4$-$M^5$-$M^2$-$M^5$-$M^1$-$M^5$- | (S-VIII-18) |
| -$M^4$-$M^5$-$M^1$-$M^5$-$M^2$-$M^5$-$M^3$-$M^5$- | (S-VIII-19) |
| -$M^4$-$M^5$-$M^1$-$M^5$-$M^3$-$M^5$-$M^2$-$M^5$- | (S-VIII-20) |
| -$M^4$-$M^5$-$M^2$-$M^5$-$M^1$-$M^5$-$M^3$-$M^5$- | (S-VIII-21) |
| -$M^4$-$M^5$-$M^2$-$M^5$-$M^3$-$M^5$-$M^1$-$M^5$- | (S-VIII-22) |
| -$M^4$-$M^5$-$M^3$-$M^5$-$M^1$-$M^5$-$M^2$-$M^5$- | (S-VIII-23) |
| -$M^4$-$M^5$-$M^3$-$M^5$-$M^2$-$M^5$-$M^1$-$M^5$- | (S-VIII-24) | wherein $M^1$ is a first monomer unit as defined herein, $M^2$ is a second monomer unit as defined herein, $M^3$ is a third monomer unit as defined herein, $M^4$ is a fourth monomer unit as defined herein, and $M^5$ is a fifth monomer unit as defined herein.

It is preferred that the present polymer comprises any one or more of the sequence units selected from the group consisting of sequence units (S-I), (S-II), (S-III), (S-IV), (S-V), (S-VI), (S-VII) and (S-VIII-01) to (S-VIII-24) in at least 50 wt % or 70 wt % or 90 wt %, even more preferably at least 95 wt % or 97 wt % or 99 wt %, still even more preferably at least 99.5 wt % or 99.7 wt % or 99.9 wt % of the total weight of said polymer, or the polymer may consist of said sequence units.

Preferably the present polymers are of the following formula (VIII)

$$-[S^0]_m-\qquad\text{(VIII)}$$

wherein $S^0$ is at each occurrence independently selected from the group consisting of sequence units (S-I), (S-II), (S-III), (S-IV), (S-V), (S-VI), (S-VII), (S-VIII-01) to (S-VIII-24), -$M^1$-$M^4$-, -$M^2$-$M^4$-, -$M^3$-$M^4$-, -$M^1$-$M^1$-, -$M^1$-$M^2$-, -$M^1$-$M^3$-, -$M^2$-$M^2$-, -$M^2$-$M^3$- and -$M^3$-$M^3$- and m is the total number of sequence units necessary to arrive at the targeted molecular weight $M_n$. Monomer units $M^1$, $M^2$, $M^3$, $M^4$ and $M^5$ are comprised in the polymer of formula (VIII) in molar ratios $m_1$, $m_2$, $m_3$, $m_4$ and $m_5$, respectively, as defined herein.

Preferred exemplary polymers may be selected from the group consisting of polymers (P-I) to (P-IX), with the compositions of the polymers being indicated in the following Table 1, wherein the columns headed "$S^1$", "$S^2$" and "$S^3$" indicate the formulae of the respective first, second and third sequence units as defined above.

TABLE 1

| Polymer | $S^1$ | $S^2$ | $S^3$ |
|---|---|---|---|
| (P-I) | (S-I) | (S-II) | — |
| (P-II) | (S-I) | — | (S-IV) |
| (P-III) | (S-I) | — | (S-V) |
| (P-IV) | (S-I) | — | (S-VI) |
| (P-V) | (S-I) | — | (S-III) |
| (P-VI) | (S-I) | (S-II) | (S-III) |
| (P-VII) | (S-I) | (S-II) | (S-VI) |
| (P-VIII) | — | (S-II) | (S-III) |
| (P-IX) | — | (S-II) | (S-IV) |

Particularly preferred polymers may be selected from the group consisting of polymers (P-I) to (P-IX), wherein—if present—
$R^{11}$, $R^{12}$, $R^{21}$, $R^{22}$, $R^{31}$, $R^{32}$ and $R^{41}$ are all *—$CH_2$—CH($CH_2$—$CH_3$)—$CH_2$—$CH_2$—$CH_2$—$CH_3$; and
$R^{51}$ to $R^{54}$ and $R^{61}$ to $R^{64}$ are all

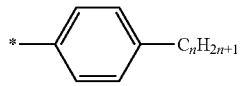

wherein n is at least 1, preferably at least 2 or 3 or 4 or 5 or 6 or 7 or 8, and at most 20, preferably at most 19 or 18 or 17 or 16 or 15 or 14 or 13 or 12.

Preferably the present polymers have a molecular weight $M_n$ of at least 5,000 g/mol, more preferably of at least 10,000 g/mol. Preferably the present polymers have a molecular weight $M_n$ of at most 250,000 g/mol, more preferably of at most 200,000 g/mol, even more preferably of at most 150,000 g/mol and most preferably of at most 100,000 g/mol.

In one aspect the present application provides for monomers that may be used in the synthesis of the polymers of the present application, i.e. for a compound comprising at least one reactive chemical group $R^a$ and any one of the first monomer units, second monomer units, third monomer units, fourth monomer units, first sequence units, second sequence units or third sequence units. Said reactive chemical group $R^a$ may be selected from the group consisting of Cl, Br, I, O-tosylate, O-triflate, O-mesylate, O-nonaflate, —$SiMe_2F$, —$SiMeF_2$, —O—$SO_2Z^1$, —$B(OZ^2)_2$, —$CZ^3$=$C(Z^3)_2$, —C≡CH, —C≡CSi($Z^1$)$_3$, —$ZnX^0$ and —$Sn(Z^4)_3$, preferably —$B(OZ^2)_2$ or —$Sn(Z^4)_3$, wherein $X^0$ is as defined above, and $Z^1$, $Z^2$, $Z^3$ and Z are selected from the group consisting of alkyl and aryl, preferably alkyl having from 1 to 10 carbon atoms, each being optionally substituted with $R^0$ as defined above, and two groups $Z^2$ may also together form a cyclic group. Alternatively such a monomer may comprise two reactive chemical groups and is for example represented by formula (IX)

$$R^a\text{-}M^0\text{-}R^b \quad (IX)$$

wherein $M^0$ comprises any one of the first monomer units, second monomer units, third monomer units, fourth monomer units, first sequence units, second sequence units, third sequence units or fourth sequence units, and $R^a$ and $R^b$ are reactive chemical groups as defined above for $R^a$.

Such monomers may be synthesized by generally known reactions, such as for example lithiation followed by reaction with a reagent that supplies the respective functional group(s). Examples of such reactions are schematically shown in Scheme 1, wherein O—R' is used in a general sense to denote a leaving group, such as for example methoxy, ethoxy or two units may form a cyclic group eg $OCH(CH_3)_2CH(CH_3)_2O$, R' correspondingly denotes for example an alkyl group, such as for example methyl and ethyl, and A may, for example, denote any one of formulae (I) to (VII).

Scheme 1

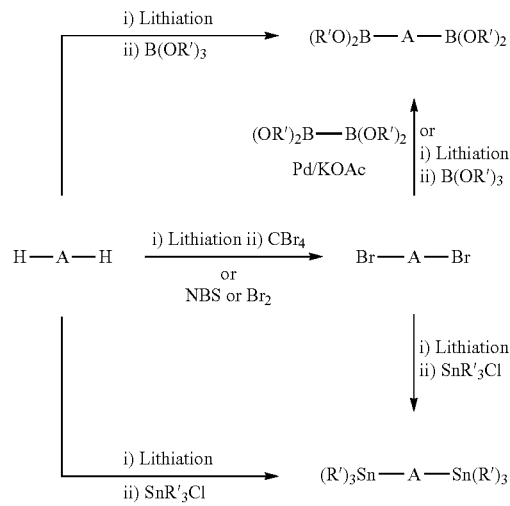

The compounds of the present invention can be synthesized according to or in analogy to methods that are known to the skilled person and are described in the literature. Other methods of preparation can be taken from the examples. For example, the polymers can be suitably prepared by aryl-aryl coupling reactions, such as Yamamoto coupling, Suzuki coupling, Stille coupling, Sonogashira coupling, Heck coupling, Negishi coupling, C—H activation coupling or Buchwald coupling. Suzuki coupling, Stille coupling and Yamamoto coupling are especially preferred. The monomers which are polymerized to form the repeat units of the polymers can be prepared according to methods which are known to the person skilled in the art.

Thus, the process for preparing the present polymers comprises the step of coupling monomers, said monomers comprising at least one or alternatively two functional monovalent group selected from the group consisting of Cl, Br, I, O-tosylate, O-triflate, O-mesylate, O-nonaflate, —$SiMe_2F$, —$SiMeF_2$, —O—$SO_2Z^1$, —$B(OZ^2)_2$, —$CZ^3$=$C(Z^3)_2$, —C≡CH, —C≡CSi($Z^1$)$_3$, —$ZnX^0$ and —$Sn(Z^4)_3$, wherein $X^0$ is halogen, and $Z^1$, $Z^2$, $Z^3$ and $Z^4$ are independently of each other selected from the group consisting of alkyl and aryl, each being optionally substituted with one or more groups $R^0$ as defined herein, and two groups $Z^2$ may also together form a cyclic group.

Preferably the polymers are prepared from monomers of general formula (IX).

Preferred aryl-aryl coupling and polymerisation methods used in the processes described above and below are Yamamoto coupling, Kumada coupling, Negishi coupling, Suzuki coupling, Stille coupling, Sonogashira coupling, Heck coupling, C—H activation coupling, Ullmann coupling or Buchwald coupling. Especially preferred are Suzuki coupling, Negishi coupling, Stille coupling and Yamamoto coupling. Suzuki coupling is described for example in WO 00/53656 A1. Negishi coupling is described for example in J. Chem. Soc., Chem. Commun., 1977, 683-684. Yamamoto coupling is described for example in T. Yamamoto et al., Prog. Polym. Sci., 1993, 17, 1153-1205, or WO 2004/022626 A1, and Stille coupling is described for example in Z. Bao et al., J. Am. Chem. Soc., 1995, 117, 12426-12435. For example, when using Yamamoto coupling, monomers having two reactive halide groups are preferably used. When using Suzuki coupling, compounds of formula (IX) having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used.

Preferred catalysts, especially for Suzuki, Negishi or Stille coupling, are selected from Pd(0) complexes or Pd(II) salts. Preferred Pd(0) complexes are those bearing at least one phosphine ligand, for example $Pd(Ph_3P)_4$. Another preferred phosphine ligand is tris(ortho-tolyl)phosphine, for example $Pd(o-Tol_3P)_4$. Preferred Pd(II) salts include palladium acetate, for example $Pd(OAc)_2$. Alternatively the Pd(0) complex can be prepared by mixing a Pd(0) dibenzylideneacetone complex, for example tris(dibenzyl-ideneacetone) dipalladium(0), bis(dibenzylidene-acetone)-palladium(0), or Pd(II) salts e.g. palladium acetate, with a phosphine ligand, for example triphenylphosphine, tris(ortho-tolyl)phosphine or tri(tert-butyl)phosphine. Suzuki polymerisation is performed in the presence of a base, for example sodium carbonate, potassium carbonate, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl)nickel(0).

As alternatives to halogens as described above, leaving groups of formula —O—$SO_2Z^1$ can be used wherein $Z^1$ is as described above. Particular examples of such leaving groups are tosylate, mesylate and triflate.

The compounds and polymers according to the present invention can also be used in mixtures or polymer blends, for example together with small molecules or monomeric compounds or together with other polymers having charge-transport, semiconducting, electrically conducting, photo-conducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more small molecules, polymers, mixtures or polymer blends as described above and below and one or more organic solvents.

Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetra-methyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, N,N-dimethylformamide, 2-chloro-6-fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylanisole, 3-methylanisole, 4-fluoro-3-methylanisole, 2-fluorobenzonitrile, 4-fluoroveratrol, 2,6-dimethylanisole, 3-fluorobenzo-nitrile, 2,5-dimethylanisole, 2,4-dimethylanisole, benzonitrile, 3,5-dimethyl-anisole, N,N-dimethylaniline, ethyl benzoate, 1-fluoro-3,5-dimethoxy-benzene, 1-methylnaphthalene, N-methylpyrrolidinone, 3-fluorobenzo-trifluoride, benzotrifluoride, dioxane, trifluoromethoxy-benzene, 4-fluorobenzotrifluoride, 3-fluoropyridine, toluene, 2-fluoro-toluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluoro-benzene, 1-chloro-2,5-difluorobenzene, 4-chlorofluorobenzene, chloro-benzene, o-dichlorobenzene, 2-chlorofluorobenzene, p-xylene, m-xylene, o-xylene or mixture of o-, m-, and p-isomers. Solvents with relatively low polarity are generally preferred. For inkjet printing solvents and solvent mixtures with high boiling temperatures are preferred. For spin coating alkylated benzenes like xylene and toluene are preferred.

Examples of especially preferred solvents include, without limitation, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, N,N-dimethylformamide, dimethylacetamide, dimethylsulfoxide, tetraline, decaline, indane, methyl benzoate, ethyl benzoate, mesitylene and/or mixtures thereof.

The concentration of the compounds or polymers in the solution is preferably 0.1 to 10% by weight, more preferably 0.5 to 5% by weight, with % by weight given relative to the total weight of the solution. Optionally, the solution also comprises one or more binders to adjust the rheological properties, as described for example in WO 2005/055248 A1.

After appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in J. D. Crowley et al., *Journal of Paint Technology*, 1966, 38 (496), 296. Solvent blends may also be used and can be identified as described in Solvents, W. H. Ellis, Federation of Societies for Coatings Technology, p. 9-10, 1986. Such a procedure may lead to a blend of 'non'-solvents that will dissolve both the polymers of the present invention, although it is desirable to have at least one true solvent in a blend.

The compounds and polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the compounds, polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Ink jet printing is particularly preferred when high resolution layers and devices need to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the compounds or polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1,2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1,2}$-alkylanilines and other fluorinated or chlorinated aromatics.

A preferred solvent for depositing a compound or polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the compound or polymer, which reduces or prevents clogging of the jets and separation of the components during spraying. The solvent(s) may include those selected from the following list of examples: dodecylbenzene, 1-methyl-4-tert-butylbenzene, terpineol, limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymer blends and formulations according to the present invention can additionally comprise one or more further components or additives selected for example from surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

The compounds and polymers of the present invention are useful as charge transport, semiconducting, electrically conducting, photoconducting or light emitting materials in optical, electrooptical, electronic, electroluminescent or photoluminescent components or devices. In these devices, the polymers of the present invention are typically applied as thin layers or films.

Thus, the present invention also provides the use of the semiconducting compound, polymer, polymers blend, formulation or layer in an electronic device. The formulation may be used as a high mobility semiconducting material in various devices and apparatus. The formulation may be used, for example, in the form of a semiconducting layer or film. Accordingly, in another aspect, the present invention provides a semiconducting layer for use in an electronic device, the layer comprising a compound, polymer blend or formulation according to the invention. The layer or film may be less than about 30 microns. For various electronic device applications, the thickness may be less than about 1 micron thick. The layer may be deposited, for example on a part of an electronic device, by any of the aforementioned solution coating or printing techniques.

The invention additionally provides an electronic device comprising a compound, polymer, polymer blend, formulation or organic semiconducting layer according to the present invention. Preferred devices are OFETs, TFTs, ICs, logic circuits, capacitors, RFID tags, OLEDs, OLETs, OPEDs, OPVs, OPDs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns. Particularly preferred devices are OPDs.

Especially preferred electronic devices are OFETs, OLEDs, OPV and OPD devices, in particular bulk heterojunction (BHJ) OPV devices and OPD devices, most particularly OPD devices. In an OFET, for example, the active semiconductor channel between the drain and source may comprise the layer of the invention. As another example, in an OLED device, the charge (hole or electron) injection or transport layer may comprise the layer of the invention.

For use in OPV or OPD devices the polymer according to the present invention is preferably used in a formulation that comprises or contains, more preferably consists essentially of, very preferably exclusively of, a p-type (electron donor) semiconductor and an n-type (electron acceptor) semiconductor. The p-type semiconductor is constituted by a polymer according to the present invention. The n-type semiconductor can be an inorganic material such as zinc oxide ($ZnO_x$), zinc tin oxide (ZTO), titan oxide ($TiO_x$), molybdenum oxide ($MoO_x$), nickel oxide ($NiO_x$), or cadmium selenide (CdSe), or an organic material such as graphene or a fullerene or a substituted fullerene, for example an indene-$C_{60}$-fullerene bisadduct like ICBA, or a (6,6)-phenyl-butyric acid methyl ester derivatized methano $C_{60}$ fullerene, also known as "PCBM-$C_{60}$" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a $C_{61}$ fullerene group, a $C_{70}$ fullerene group, or a $C_{71}$ fullerene group, or an organic polymer (see for example Coakley, K. M. and McGehee, M. D. *Chem. Mater.* 2004, 16, 4533).

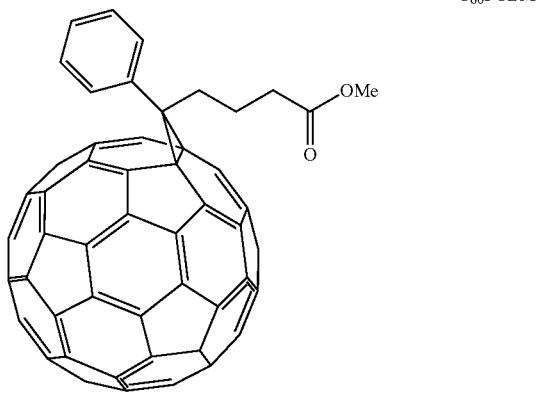

$C_{60}PCBM$

Preferably the polymer according to the present invention is blended with an n-type semiconductor such as a fullerene or substituted fullerene, like for example PCBM-$C_{60}$, PCBM-$C_{70}$, PCBM-$C_{61}$, PCBM-$C_{71}$, bis-PCBM-$C_{61}$, bis-PCBM-$C_{71}$, ICMA-$c_{60}$ (1',4'-Dihydro-naphtho[2',3':1,2][5,6]fullerene-$C_6$), ICBA-$C_6$, oQDM-$C_{60}$ (1',4'-dihydro-naphtho[2',3':1,9][5,6]fullerene-C60-Ih), bis-oQDM-$C_6$, graphene, or a metal oxide, like for example, $ZnO_x$, $TiO_x$, ZTO, $MoO_x$, $NiO_x$, or quantum dots like for example CdSe or CdS, to form the active layer in an OPV or OPD device. The device preferably further comprises a first transparent or semi-transparent electrode on a transparent or semi-transparent substrate on one side of the active layer, and a second metallic or semi-transparent electrode on the other side of the active layer.

Further preferably the OPV or OPD device comprises, between the active layer and the first or second electrode, one or more additional buffer layers acting as hole transporting layer and/or electron blocking layer, which comprise a material such as metal oxide, like for example, ZTO, $MoO_x$, $NiO_x$, a conjugated polymer electrolyte, like for example PEDOT:PSS, a conjugated polymer, like for example polytriarylamine (PTAA), an organic compound, like for example N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD), or alternatively as hole blocking layer and/or electron transporting layer, which comprise a material such as metal oxide, like for example, $ZnO_x$, $TiO_x$, a salt, like for example LiF, NaF, CsF, a conjugated polymer electrolyte, like for example poly[3-(6-trimethylammoniumhexyl)thiophene], poly(9,9-bis(2-ethylhexyl)-fluorene]-b-poly[3-(6-trimethylammoniumhexyl)thiophene], or poly[(9,9-bis(3'-(N,N-dimethyl-amino)propyl)-2,7-fluorene)-alt-2,7-(9,9-dioctylfluorene)] or an organic compound, like for example tris(8-quinolinolato)-aluminium(III) ($Alq_3$), 4,7-diphenyl-1,10-phenanthroline.

In a blend or mixture of a polymer according to the present invention with a fullerene or modified fullerene, the ratio polymer:fullerene is preferably from 5:1 to 1:5 by weight, more preferably from 1:1 to 1:3 by weight, most preferably 1:1 to 1:2 by weight. A polymeric binder may also be included, from 5 to 95% by weight. Examples of binder include polystyrene (PS), polypropylene (PP) and polymethylmethacrylate (PMMA).

To produce thin layers in BHJ OPV devices the compounds, polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. For the fabrication of OPV devices and modules area printing methods compatible with flexible substrates are preferred, for example slot dye coating, spray coating and the like.

Suitable solutions or formulations containing the blend or mixture of a polymer according to the present invention with a $C_{60}$ or $C_{70}$ fullerene or modified fullerene like PCBM must be prepared. In the preparation of formulations, suitable solvent must be selected to ensure full dissolution of both component, p-type and n-type and take into account the boundary conditions (for example rheological properties) introduced by the chosen printing method.

Organic solvents are generally used for this purpose. Typical solvents can be aromatic solvents, halogenated solvents or chlorinated solvents, including chlorinated aromatic solvents. Examples include, but are not limited to chlorobenzene, 1,2-dichlorobenzene, chloroform, 1,2-dichloroethane, dichloromethane, carbon tetrachloride, toluene, cyclohexanone, ethylacetate, tetrahydrofuran, anisole, morpholine, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and combinations thereof.

The OPV device can for example be of any type known from the literature (see e.g. Waldauf et al., *Appl. Phys. Lett.*, 2006, 89, 233517).

A first preferred OPV device according to the invention comprises the following layers (in the sequence from bottom to top):
  optionally a substrate,
  a high work function electrode, preferably comprising a metal oxide, like for example ITO, serving as anode,
  an optional conducting polymer layer or hole transport layer, preferably comprising an organic polymer or polymer blend, for example of PEDOT:PSS (poly(3,4-ethylenedioxythiophene):poly(styrene-sulfonate), or TBD (N,N'-dyphenyl-N—N'-bis(3-methylphenyl)-1,1'biphenyl-4,4'-diamine) or NBD (N,N'-dyphenyl-N—N'-bis(1-napthylphenyl)-1,1'biphenyl-4,4'-diamine),
  a layer, also referred to as "active layer", comprising a p-type and an n-type organic semiconductor, which can exist for example as a p-type/n-type bilayer or as distinct p-type and n-type layers, or as blend or p-type and n-type semiconductor, forming a BHJ,
  optionally a layer having electron transport properties, for example comprising LiF,
  a low work function electrode, preferably comprising a metal like for example aluminum, serving as cathode,
wherein at least one of the electrodes, preferably the anode, is transparent to visible light, and
wherein the p-type semiconductor is a polymer according to the present invention.

A second preferred OPV device according to the invention is an inverted OPV device and comprises the following layers (in the sequence from bottom to top):
  optionally a substrate, a high work function metal or metal oxide electrode, comprising for example ITO, serving as cathode, a layer having hole blocking properties, preferably comprising a metal oxide like $TiO_x$ or $Zn_x$, an active layer comprising a p-type and an n-type organic semiconductor, situated between the electrodes, which can exist for example as a p-type/n-type bilayer or as distinct p-type and n-type layers, or as blend or p-type and n-type semiconductor, forming a BHJ, an optional conducting polymer layer or hole transport layer, preferably comprising an organic polymer or polymer blend, for example of PEDOT:PSS or TBD or NBD, an electrode comprising a high work function metal like for example silver, serving as anode, wherein at least one of the electrodes, preferably the cathode, is transparent to visible light, and wherein the p-type semiconductor is a polymer according to the present invention.

In the OPV devices of the present invention the p-type and n-type semiconductor materials are preferably selected from the materials, like the polymer/fullerene systems, as described above When the active layer is deposited on the substrate, it forms a BHJ that phase separates at nanoscale level. For discussion on nanoscale phase separation see Dennler et al, *Proceedings of the IEEE*, 2005, 93 (8), 1429 or Hoppe et al, *Adv. Func. Mater,* 2004, 14(10), 1005. An optional annealing step may be then necessary to optimize blend morpohology and consequently OPV device performance.

Another method to optimize device performance is to prepare formulations for the fabrication of OPV(BHJ) devices that may include high boiling point additives to promote phase separation in the right way. 1,8-Octanedithiol, 1,8-diiodooctane, nitrobenzene, chloronaphthalene, and other additives have been used to obtain high-efficiency solar cells. Examples are disclosed in J. Peet, et al, *Nat. Mater.*, 2007, 6, 497 or Fréchet et al. *J. Am. Chem. Soc.,* 2010, 132, 7595-7597.

The compounds, polymers, formulations and layers of the present invention are also suitable for use in an OFET as the semiconductive channel. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a compound, polymer, polymer blend, formulation or organic semiconducting layer according to the present invention. Other features of the OFET are well known to those skilled in the art.

OFETs where an OSC material is arranged as a thin film between a gate dielectric and a drain and a source electrode, are generally known, and are described for example in U.S. Pat. Nos. 5,892,244, 5,998,804, 6,723,394 and in the references cited in the background section. Due to the advantages, like low cost production using the solubility properties of the compounds according to the invention and thus the processibility of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises:
 a source electrode,
 a drain electrode,
 a gate electrode,
 a semiconducting layer,
 one or more gate insulator layers, and
 optionally a substrate,
wherein the semiconductor layer preferably comprises a compound, polymer, polymer blend or formulation as described above and below.

The OFET device can be a top gate device or a bottom gate device. Suitable structures and manufacturing methods of an OFET device are known to the skilled in the art and are described in the literature, for example in US 2007/0102696 A1.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a low permittivity (or dielectric constant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetary value, like stamps, tickets, shares, cheques etc.

Alternatively, the materials according to the invention can be used in OLEDs, e.g. as the active display material in a flat panel display applications, or as backlight of a flat panel display like e.g. a liquid crystal display. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the present invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Müller et al, *Synth. Metals,* 2000, 111-112, 31-34, Alcala, *J. Appl. Phys.,* 2000, 88, 7124-7128 and the literature cited therein.

According to another use, the materials according to this invention, especially those showing photoluminescent properties, may be employed as materials of light sources, e.g. in display devices, as described in EP 0 889 350 A1 or by C. Weder et al., *Science,* 1998, 279, 835-837.

A further aspect of the invention relates to both the oxidised and reduced form of the compounds according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidizing or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantation of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$—, $—NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)(SbF_6^-)$, $(NO_2^+)(SbCl_6^-)$, $(NO_2^+)(BF_4^-)$, $AgClO_4$, $H_2IrCl_6$, $La(NO_3)_3 \cdot 6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

The compounds and formulations according to the present invention may also be suitable for use in organic plasmon-emitting diodes (OPEDs), as described for example in Koller et al., *Nat. Photonics,* 2008, 2, 684.

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913 A1.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, *Proc. Natl. Acad. Sci. U.S.A.,* 1999, 96, 12287; D. Wang, X. Gong, P. S. Heeger, F. Rininsland, G. C. Bazan and A. J. Heeger, *Proc. Natl. Acad. Sci. U.S.A.,* 2002, 99, 49; N. DiCesare, M. R. Pinot, K. S. Schanze and J. R. Lakowicz, *Langmuir,* 2002, 18, 7785; D. T. McQuade, A. E. Pullen, T. M. Swager, *Chem. Rev.,* 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius. The values of the dielectric constant ε ("permittivity") refer to values taken at 20° C. and 1,000 Hz.

EXAMPLES

Example 1

To a mixture of 4,7-dibromo-[1,2,5]thiadiazolo[3,4-c] pyridine (88.5 mg, 0.300 mmol), 7,7-bis-(2-ethyl-hexyl)-2, 5-bis-trimethylstannanyl-7H-3,4-dithia-7-sila-cyclopenta[a] pentalene (111.7 mg, 0.150 mmol), 7,7-bis-(2-ethyl-hexyl)-2,5-bis-trimethylstannanyl-7H-3,4-dithia-7-germa-cyclopenta[a]pentalene (118.3 mg, 0.150 mmol) and tri-o- tolylphosphine (30.1 mg, 0.099 mmol) was added degassed toluene (6.4 cm³). The resulting mixture was degassed for further 30 minutes before the addition of tris(dibenzylideneacetone)dipalladium(0) (19.0 mg, 0.027 mmol). The resulting mixture was then heated at 110° C. in a pre-heated oil bath for 17 hours. Bromobenzene (0.006 cm³) was then added and the mixture stirred at 110° C. for 30 minutes. Phenyl tributyltin (0.03 cm³) was then added and the mixture stirred at 110° C. for 60 minutes. The reaction mixture was allowed to cool slightly and poured into stirred methanol (300 cm³). The solid was then collected by filtration and washed with acetone (50 cm³). The crude polymer was subjected to sequential Soxhlet extraction with acetone, 40-60 petrol, 80-100 petrol, cyclohexane, chloroform and chlorobenzene, respectively. The chlorobenzene extract was poured into methanol (500 cm³) and the polymer precipitate collected by filtration to give polymer 1 (62 mg, 36%) as a black solid.

GPC (chlorobenzene, 50° C.): $M_n$=36,900 g/mol, $M_w$=359,000 g/mol.

Example 2

To a mixture of 4,7-dibromo-[1,2,5]thiadiazolo[3,4-c]pyridine (147.5 mg, 0.500 mmol), 7,7-bis-(2-ethyl-hexyl)-2,5-bis-trimethylstannanyl-7H-3,4-dithia-7-sila-cyclopenta[a]pentalene (279.1 mg, 0.375 mmol), 7,7-bis-(2-ethylhexyl)-2,5-bis-trimethylstannanyl-7H-3,4-dithia-7-germa-cyclopenta[a]pentalene (98.6 mg, 0.125 mmol) and tri-o-tolylphosphine (50.2 mg, 0.165 mmol) was added degassed toluene (10.6 cm³). The resulting mixture was degassed for further 30 minutes before addition of tris(dibenzylideneacetone)dipalladium(0) (31.7 mg, 0.045 mmol). The resulting mixture was then heated at 110° C. in a pre-heated oil bath for 17 hours. Bromobenzene (0.006 cm³) was then added and the mixture stirred at 110° C. for 30 minutes. Phenyl tributyltin (0.03 cm³) was then added and the mixture stirred at 110° C. for 60 minutes. The reaction mixture was allowed to cool slightly and poured into stirred methanol (300 cm³). The solid was collected by filtration and washed with acetone (50 cm³). The crude polymer was subjected to sequential Soxhlet extraction with acetone, 40-60 petrol, 80-100 petrol, cyclohexane and chloroform, respectively. The chloroform extract was poured into methanol (300 cm³) and the polymer precipitate collected by filtration to give polymer 2 (224 mg, 79%) as a black solid.

GPC (chlorobenzene, 50° C.): $M_n$=13,300 g/mol, $M_w$=77,300 g/mol.

Example 3

To a mixture of 7,7-bis-(2-ethyl-hexyl)-2,5-bis-trimethylstannanyl-7H-3,4-dithia-7-germa-cyclopenta[a]pentalene (597.4 mg, 0.757 mmol), 7,7-bis-(2-ethyl-hexyl)-2,5-bis-trimethylstannanyl-7H-3,4-dithia-7-sila-cyclopenta[a]pentalene (205.4 mg, 0.276 mmol), 4,7-dibromo-[1,2,5]thiadiazolo[3,4-c]pyridine (142.2 mg, 0.258 mmol) and tri-o-tolylphosphine (50.2 mg, 0.17 mmol) was added degassed anhydrous toluene (18 cm³) and the reaction mixture further degassed for 30 minutes. Tris(dibenzylideneacetone)dipalladium(0) (31.7 mg, 0.05 mmol) was then added and the mixture heated at 110° C. in a pre-heated block for 17 hours. Bromobenzene (0.01 cm³) was then added and the mixture stirred at 110° C. for 30 minutes. Phenyl tributyltin (0.05 cm³) was then added and the mixture stirred at 110° C. for 30 minutes. The reaction mixture was allowed to cool slightly and poured into stirred methanol (100 cm³). The solid was collected by filtration and subjected to sequential Soxhlet extraction with acetone, 40-60 petrol, 80-100 petrol, cyclohexane and chloroform, respectively. The chloroform extract was poured into methanol (300 cm³) and the polymer precipitate collected by filtration to give polymer 3 (371 mg, 56%) as a black solid.

GPC (chlorobenzene, 50° C.): $M_n$=21,000 g/mol, $M_w$=40,000 g/mol.

Example 4

To a mixture of monomer 4,7-dibromo-[1,2,5]thiadiazolo[3,4-c]pyridine (149.4 mg, 0.507 mmol), 1,1'-[4,9-dihydro-4,4,9,9-tetrakis(4-hexadecylphenyl)-s-indaceno[1,2-b:5,6-b']dithiophene-2,7-diyl]bis[1,1,1-trimethyl-stannane] (227.2 mg, 0.127 mmol), 7,7-bis-(2-ethyl-hexyl)-2,5-bis-trimethyl-stannanyl-7H-3,4-dithia-7-germa-cyclopenta[a]pentalene (299.7 mg, 0.380 mmol) and tri-o-tolylphosphine (51 mg, 0.17 mmol) was added degassed anhydrous toluene (10.7 cm³) and the reaction mixture further degassed for 30 minutes. Tris(dibenzylideneacetone) dipalladium(0) (32.1 mg, 0.05 mmol) was then added and the mixture heated at 110° C. in a pre-heated block for 17 hours. Bromobenzene (0.01 cm³) was added and the mixture stirred at 110° C. for 30 minutes followed by addition of phenyl tributyltin (0.05 cm³). The reaction mixture was heated at 110° C. for a further 30 minutes. The reaction mixture was allowed to cool slightly and poured into stirred methanol (100 cm³). The solid was collected by filtration and subjected to sequential Soxhlet extraction with acetone, 40-60 petrol, 80-100 petrol, cyclohexane and chloroform, respectively. The chloroform extract was poured into stirred methanol (400 cm³) and the solid collected by filtration to give polymer 4 (351 mg, 83%) as a black solid.

GPC (chlorobenzene, 50° C.): $M_n$=35,000 g/mol, $M_w$=82,000 g/mol.

Example 5

To a mixture of 4,7-dibromo-[1,2,5]thiadiazolo[3,4-c]pyridine (151.4 mg, 0.513 mmol), 1,1'-[6,6,12,12-tetrakis(4-hexadecylphenyl)-6,12-dihydrodithieno[2,3-d:2',3'-d']-s-indaceno[1,2-b:5,6-b']dithiophene-2,8-diyl]bis[1,1,1-trimethyl-stannane](244.6 mg, 0.128 mmol), 7,7-bis-(2-ethyl-hexyl)-2,5-bis-trimethylstannanyl-7H-3,4-dithia-7-germa-cyclopenta[a]pentalene (303.7 mg, 0.385 mmol) and tri-o-tolylphosphine (51.6 mg, 0.17 mmol) was added degassed anhydrous toluene (10.9 cm³) and the reaction mixture further degassed for 30 minutes. Tris(dibenzylideneacetone)dipalladium(0) (32.5 mg, 0.05 mmol) was then added and the mixture heated at 110° C. in a pre-heated block for 17 hours. Bromobenzene (0.01 cm³) was added and the mixture stirred at 110° C. for 30 minutes followed by addition of phenyl tributyltin (0.05 cm³). The reaction mixture was then heated at 110° C. for a further 30 minutes. The reaction mixture was allowed to cool slightly and poured into stirred methanol (100 cm³). The solid was collected by filtration and subjected to sequential Soxhlet extraction with acetone, 40-60 petrol, 80-100 petrol, cyclohexane and chloroform, respectively. The chloroform extract is poured into stirred methanol (400 cm³) and the solid collected by filtration to give polymer 5 (400 mg, 90%) as a black solid.

GPC (chlorobenzene, 50° C.): $M_n$=28,000 g/mol, $M_w$=88,000 g/mol.

Example 6

To a mixture of 4,7-dibromo-[1,2,5]thiadiazolo[3,4-c]pyridine (141.6 mg, 0.480 mmol), 4-(2-ethyl-hexyl)-2,6-bistrimethylstannanyl-4H-dithieno[3,2-b;2',3'-d]pyrrole (59.3 mg, 0.096 mmol), 7,7-bis-(2-ethyl-hexyl)-2,5-bis-trimethylstannanyl-7H-3,4-dithia-7-germa-cyclopenta[a]pentalene (303.0 mg, 0.384 mmol) and tri-o-tolylphosphine (48 mg, 0.16 mmol) was added degassed anhydrous toluene (10.2 cm$^3$) and the reaction mixture further degassed for 30 minutes. Tris(dibenzylideneacetone)dipalladium(0) (30.4 mg, 0.04 mmol) was then added and the mixture heated at 110° C. in a pre-heated block for 30 minutes. The reaction mixture was allowed to cool slightly and poured into stirred methanol (50 cm$^3$). The solid was collected by filtration to give polymer 6 (240 mg, 88%) as a black solid.

Example 7

To a mixture of 4,7-dibromo-[1,2,5]thiadiazolo[3,4-c]pyridine (147.5 mg, 0.500 mmol), 4,4-bis-(2-ethyl-hexyl)-2,6-bis-trimethylstannanyl-4H-cyclopenta[2,1-b;3,4-b']dithiophene (182.1 mg, 0.250 mmol), 7,7-bis-(2-ethyl-hexyl)-2,5-bis-trimethylstannanyl-7H-3,4-dithia-7-germa-cyclopenta[a]pentalene (197.2 mg, 0.250 mmol) and tri-o-tolylphosphine (50 mg, 0.17 mmol) was added degassed anhydrous toluene (10.6 cm$^3$) and the reaction mixture further degassed for 30 minutes. Tris(dibenzylideneacetone)dipalladium(0) (31.7 mg, 0.05 mmol) was then added and the mixture heated at 110° C. in a pre-heated block for 17 hours. Bromo-benzene (0.01 cm$^3$) was added and the mixture stirred at 110° C. for 30 minutes followed by addition of phenyl tributyltin (0.05 cm$^3$). The reaction mixture was then heated at 110° C. for a further 60 minutes. The reaction mixture was allowed to cool slightly, poured into stirred methanol (500 cm$^3$) and washed with acetone (50 cm$^3$). The solid was collected by filtration and subjected to sequential Soxhlet extraction with acetone, 40-60 petrol, 80-100 petrol, cyclohexanes and chloroform, respectively. The chloroform extract was poured into stirred methanol (500 cm$^3$) and the solid collected by filtration to give polymer 7 (241 mg, 85%) as a black solid.

GPC (chlorobenzene, 50° C.): $M_n$=30,100 g/mol, $M_w$=99,100 g/mol.

Example 8

To a mixture of 4,7-dibromo-[1,2,5]thiadiazolo[3,4-c]pyridine (147.5 mg, 0.500 mmol), 4,4-bis-(2-ethyl-hexyl)-2,6-bis-trimethylstannanyl-4H-cyclopenta[2,1-b;3,4-b']dithiophene (182.1 mg, 0.250 mmol), 7,7-bis-(2-ethyl-hexyl)-2,5-bis-trimethylstannanyl-7H-3,4-dithia-7-sila-cyclopenta[a]pentalene (186.1 mg, 0.250 mmol) and tri-o-tolylphosphine (50 mg, 0.17 mmol) was added degassed anhydrous toluene (10.6 cm$^3$) and the reaction mixture further degassed for 30 minutes. Tris(dibenzylideneacetone)dipalladium(0) (31.7 mg, 0.05 mmol) was then added and the mixture heated at 110° C. in a pre-heated block for 17 hours. Bromobenzene (0.01 cm$^3$) was added and the mixture stirred at 110° C. for 30 minutes followed by addition of phenyl tributyltin (0.05 cm$^3$). The reaction mixture was then heated at 110° C. for a further 60 minutes. The reaction mixture was allowed to cool slightly, poured into stirred methanol (500 cm$^3$) and washed with acetone (50 cm$^3$). The solid was collected by filtration and subjected to sequential Soxhlet extraction with acetone, 40-60 petrol, 80-100 petrol, cyclohexane and chloroform, respectively. The chloroform extract was poured into stirred methanol (500 cm$^3$) and the solid collected by filtration to give polymer 8 (217 mg, 80%) as a black solid.

GPC (chlorobenzene, 50° C.): $M_n$=12,400 g/mol, $M_w$=34,700 g/mol.

Example 9

To a mixture of 4,7-dibromo-[1,2,5]thiadiazolo[3,4-c]pyridine (190.6 mg, 0.646 mmol), 1,1'-[6,6,12,12-tetrakis(4-hexadecylphenyl)-6,12-dihydrodithieno[2,3-d:2',3'-d']-s-indaceno[1,2-b:5,6-b']dithiophene-2,8-diyl]bis[1,1,1-trimethyl-stannane](246.4 mg, 0.129 mmol), 7,7-bis-(2-ethyl-hexyl)-2,5-bis-trimethylstannanyl-7H-3,4-dithia-7-sila-cyclopenta[a]pentalene (185.6 mg, 0.249 mmol), 7,7-bis-(2-ethyl-hexyl)-2,5-bis-trimethylstannanyl-7H-3,4-dithia-7-germa-cyclopenta[a]pentalene (211.2 mg, 0.268 mmol) and tri-o-tolylphosphine (25 mg, 0.08 mmol) was added degassed anhydrous toluene (13 cm$^3$) and the reaction mixture further degassed for 30 minutes. Tris(dibenzylideneacetone)dipalladium(0) (15.8 mg, 0.02 mmol) was then added and the mixture heated at 110° C. in a pre-heated block for 17 hours. Bromobenzene (0.01 cm$^3$) was added and the mixture stirred at 110° C. for 30 minutes followed by addition of phenyl tributyltin (0.05 cm$^3$). The reaction mixture was then heated at 110° C. for a further 30 minutes. The reaction mixture was allowed to cool slightly and poured into stirred methanol (100 cm$^3$). The solid was then collected by filtration and subjected to sequential Soxhlet extraction with acetone, 40-60 petrol, 80-100 petrol, cyclohexane and chloroform, respectively. The chloroform extract was poured into stirred methanol (400 cm$^3$) and the solid collected by filtration to give polymer 9 (458 mg, 88%) as a black solid.

GPC (chlorobenzene, 50° C.): $M_n$=22,000 g/mol, $M_w$=41,000 g/mol.

Example 10

To a mixture of 4,7-dibromo-[1,2,5]thiadiazolo[3,4-c]pyridine (152.1 mg, 0.516 mmol), 4,4-bis-(2-ethyl-hexyl)-2,6-bis-trimethylstannanyl-4H-cyclopenta[2,1-b;3,4-b']dithiophene (125.4 mg, 0.172 mmol), 7,7-bis-(2-ethyl-hexyl)-2,5-bis-trimethylstannanyl-7H-3,4-dithia-7-sila-cyclopenta[a]pentalene (124.9 mg, 0.168 mmol), 7,7-bis-(2-ethyl-hexyl)-2,5-bis-trimethylstannanyl-7H-3,4-dithia-7-germa-cyclopenta[a]pentalene (138.6 mg, 0.176 mmol) and tri-o-tolylphosphine (25 mg, 0.08 mmol) was added degassed anhydrous toluene (10 cm$^3$) and the reaction mixture further degassed for 30 minutes. Tris(dibenzylideneacetone)dipalladium(0) (15.8 mg, 0.02 mmol) was then added and the mixture heated at 110° C. in a pre-heated block for 17 hours. Bromobenzene (0.01 cm$^3$) was added and the mixture stirred at 110° C. for 30 minutes followed by addition of phenyl tributyltin (0.05 cm$^3$). The reaction mixture was then heated at 110° C. for a further 30 minutes. The reaction mixture was allowed to cool slightly and poured into stirred methanol (100 cm$^3$). The solid was collected by filtration and subjected to sequential Soxhlet extraction with acetone, 40-60 petrol, 80-100 petrol, cyclohexane and chloroform, respectively. The chloroform extract was poured into stirred methanol (300 cm$^3$) and the solid collected by filtration to give polymer 10 (201 mg, 69%) as a black solid.

GPC (chlorobenzene, 50° C.): $M_n$=26,000 g/mol, $M_w$=63,000 g/mol.

Example 11

To a mixture of 4,7-dibromo-[1,2,5]thiadiazolo[3,4-c]pyridine (126.5 mg, 0.429 mmol), 4-(2-ethyl-hexyl)-2,6-bistrimethylstannanyl-4H-dithieno[3,2-b;2',3'-d]pyrrole (106.2 mg, 0.172 mmol), 7,7-Bis-(2-ethyl-hexyl)-2,5-bis-trimethylstannanyl-7,7a-dihydro-3 aH-3,4-dithia-7-sila-cyclopenta[a]pentalene (192.1 mg, 0.257 mmol) and tri-o-tolylphosphine (43 mg, 0.14 mmol) was added degassed anhydrous toluene (13.6 cm$^3$) and the reaction mixture further degassed for 30 minutes. Tris(dibenzylideneacetone)dipalladium(0) (27.2 mg, 0.04 mmol) was then added and the mixture heated at 110° C. in a pre-heated block for 2 hours. Bromobenzene (0.01 cm$^3$) was added and the mixture stirred at 110° C. for 30 minutes followed by addition of phenyl tributyltin (0.04 cm$^3$). The reaction mixture was then heated at 110° C. for a further 60 minutes. The reaction mixture was allowed to cool slightly and poured into stirred methanol (300 cm$^3$). The solid was collected by filtration and washed with acetone (50 cm$^3$) to give polymer 11 (184 mg, 86%) as a black solid.

Example 12

To a mixture of 4,7-dibromo-[1,2,5]thiadiazolo[3,4-c]pyridine (300.1 mg, 1.018 mmol), 7,7-bis-(2-ethyl-hexyl)-2,5-bis-trimethylstannanyl-7H-3,4-dithia-7-germa-cyclopenta[a]pentalene (501.7 mg, 0.636 mmol), 7,7-Bis-(2-ethyl-hexyl)-2,5-bis-trimethylstannanyl-7,7a-dihydro-3 aH-3,4-dithia-7-sila-cyclopenta[a]pentalene (473.4 mg, 0.636 mmol), 2,5-dibromothiophene (61.5 mg, 0.254 mmol) and tri-o-tolylphosphine (64 mg, 0.21 mmol) was added degassed anhydrous toluene (10.1 cm$^3$) and the reaction mixture further degassed for 30 minutes. Tris(dibenzylideneacetone)dipalladium(0) (40.3 mg, 0.06 mmol) was then added and the mixture heated at 110° C. in a pre-heated block for 17 hours. Bromo-benzene (0.01 cm$^3$) was added and the mixture stirred at 110° C. for 30 minutes followed by addition of phenyl tributyltin (0.06 cm$^3$). The reaction mixture was then heated at 110° C. for a further 60 minutes. The reaction mixture was allowed to cool slightly, poured into stirred methanol (300 cm$^3$) and the solid collected by filtration and washed with acetone (50 cm$^3$). The solid was subjected to sequential Soxhlet extraction: acetone, 40-60 petrol, 80-100 petrol, cyclohexanes and chloroform. The chloroform extract was poured into stirred methanol (500 cm$^3$) and the solid collected by filtration to give polymer 12 (565 mg, 78%) as a black solid.

GPC (chlorobenzene, 50° C.) M$_n$=21,000 g/mol, M$_w$=84,000 g/mol.

Example 13

To a mixture of 4,7-dibromo-[1,2,5]thiadiazolo[3,4-c]pyridine (122.4 mg, 0.415 mmol), 4,4-bis-(2-ethyl-hexyl)-2,6-bis-trimethylstannanyl-4H-cyclopenta[2,1-b;3,4-b']dithiophene (75.6 mg, 0.104 mmol), 7,7-bis-(2-ethyl-hexyl)-2,5-bis-trimethylstannanyl-7H-3,4-dithia-7-sila-cyclopenta[a]pentalene (231.7 mg, 0.311 mmol) and tri-o-tolylphosphine (42 mg, 0.14 mmol) was added degassed anhydrous toluene (4.4 cm$^3$) and the reaction mixture further degassed for 30 minutes. Tris(dibenzylideneacetone)dipalladium(0) (26.3 mg, 0.04 mmol) was then added and the mixture heated at 110° C. in a pre-heated block for 17 hours. Bromo-benzene (0.01 cm$^3$) was added and the mixture stirred at 110° C. for 30 minutes followed by addition of phenyl tributyltin (0.05 cm$^3$). The reaction mixture was then heated at 110° C. for a further 60 minutes. The reaction mixture was allowed to cool slightly, poured into stirred methanol (500 cm$^3$) and washed with acetone (50 cm$^3$). The solid was collected by filtration and subjected to sequential Soxhlet extraction: acetone, 40-60 petrol, 80-100 petrol, cyclohexanes and chloroform. The chloroform extract was poured into stirred methanol (500 cm$^3$) and the solid collected by filtration to give polymer 13 (197 mg, 86%) as a black solid.

GPC (chlorobenzene, 50° C.) M$_n$=22,000 g/mol, M$_w$=68,000 g/mol.

Example 14

To a mixture of 4,7-dibromo-[1,2,5]thiadiazolo[3,4-c]pyridine (530.9 mg, 1.800 mmol), 7,7-bis-(3,7-dimethyl-octyl)-2,5-bis-trimethylstannanyl-7H-3,4-dithia-7-sila-cyclopenta[a]pentalene (360.2 mg, 0.450 mmol), 7,7-bis-(2-ethyl-hexyl)-2,5-bis-trimethylstannanyl-7H-3,4-dithia-7-sila-cyclopenta[a]pentalene (669.9 mg, 0.900 mmol), 7-bis-(2-ethyl-hexyl)-2,5-bis-trimethylstannanyl-7H-3,4-dithia-7-germa-cyclopenta[a]pentalene (355.0 mg, 0.450 mmol) and tri-o-tolylphosphine (181 mg, 0.59 mmol) was added degassed anhydrous toluene (38.1 cm$^3$) and the reaction mixture further degassed for 30 minutes. Tris(dibenzylideneacetone) dipalladium(0) (114 mg, 0.16 mmol) was then added and the mixture heated at 110° C. in a pre-heated block for 17 hours. Bromo-benzene (0.04 cm$^3$) was added and the mixture stirred at 110° C. for 30 minutes followed by addition of phenyl tributyltin (0.18 cm$^3$). The reaction mixture was then heated at 110° C. for a further 60 minutes. The reaction mixture was allowed to cool slightly, poured into stirred methanol (300 cm$^3$) and washed with acetone (50 cm$^3$). The solid was collected by filtration and subjected to sequential Soxhlet extraction: acetone, 40-60 petrol, 80-100 petrol, cyclohexanes and chloroform. The chloroform extract was poured into stirred methanol (300 cm$^3$) and the solid collected by filtration to give polymer 14 (892 mg, 79%) as a black solid.

GPC (chlorobenzene, 50° C.) M$_n$=15,900 g/mol, M$_w$=107,200 g/mol.

Comparative Example 1 (Polymer 15)

To a mixture of 4,7-dibromo-[1,2,5]thiadiazolo[3,4-c]pyridine (102.6 mg, 0.348 mmol), 7,7-bis-(2-ethyl-hexyl)-2,5-bis-trimethylstannanyl-7H-3,4-dithia-7-germa-cyclopenta[a]pentalene (274.5 mg, 0.348 mmol) and tri-o-tolylphosphine (35.0 mg, 0.115 mmol) was added degassed toluene (7.4 cm$^3$). The resulting mixture was degassed for further 30 minutes before addition of tris(dibenzylideneacetone) dipalladium(0) (22.0 mg, 0.031 mmol). The resulting mixture was then heated at 110° C. in a pre-heated oil bath for 17 hours. Bromobenzene (0.007 cm$^3$) was then added and the mixture stirred at 110° C. for 30 minutes. Phenyl tributyltin (0.03 cm$^3$) was then added and the mixture stirred at 110° C. for 60 minutes. The reaction mixture was allowed to cool slightly and poured into stirred methanol (300 cm$^3$). The solid was collected by filtration and washed with acetone (50 cm$^3$). The crude polymer was subjected to sequential Soxhlet extraction with acetone, 40-60 petrol, 80-100 petrol, cyclohexane and chloroform, respectively. The chloroform extract was poured into methanol (500 cm$^3$) and the polymer precipitate collected by filtration to give polymer 15 (111 mg, 53%) as a black solid.

GPC (chlorobenzene, 50° C.): M$_n$=13,500 g/mol, M$_w$=42,400 g/mol.

Comparative Example 2 (Polymer 16)

To a mixture of 4,7-dibromo-[1,2,5]thiadiazolo[3,4-c]pyridine (102.6 mg, 0.348 mmol), 7,7-bis-(2-ethyl-hexyl)-

2,5-bis-trimethylstannanyl-7H-3,4-dithia-7-sila-cyclopenta[a]pentalene (259.1 mg, 0.348 mmol), and tri-o-tolylphosphine (35.0 mg, 0.12 mmol) was added degassed toluene (7.4 cm³). The resulting mixture was degassed for further 30 minutes before the addition of tris(dibenzylideneacetone) dipalladium(0) (22.0 mg, 0.031 mmol). The resulting mixture was then heated at 110° C. in a pre-heated oil bath for 17 hours. Bromobenzene (0.007 cm³) was then added and the mixture stirred at 110° C. for 30 minutes. Phenyl tributyltin (0.03 cm³) was then added and the mixture stirred at 110° C. for 60 minutes. The reaction mixture was allowed to cool slightly and poured into stirred methanol (300 cm³). The solid was collected by filtration and washed with acetone (50 cm³). The crude polymer was subjected to sequential Soxhlet extraction with acetone, 40-60 petrol, 80-100 petrol, cyclohexane, chloroform and chlorobenzene, respectively. The chlorobenzene extract was poured into methanol (500 cm³) and the polymer precipitate collected by filtration to give polymer 16 (80 mg, 42%) as a black solid.

GPC (chlorobenzene, 50° C.): $M_n$=36,100 g/mol, $M_w$=182,500 g/mol.

Comparative Example 3 (Polymer 17)

To a mixture of 4,7-dibromo-benzo[1,2,5]thiadiazole (176.4 mg, 0.600 mmol), 4,4-bis-(2-ethyl-hexyl)-2,6-bis-trimethylstannanyl-4H-cyclopenta[2,1-b;3,4-b']dithiophene (218.5 mg, 0.300 mmol), 7,7-bis-(2-ethyl-hexyl)-2,5-bis-trimethylstannanyl-7H-3,4-dithia-7-sila-cyclopenta[a]pentalene (223.3 mg, 0.300 mmol) and tri-o-tolylphosphine (30 mg, 0.10 mmol) was added degassed anhydrous toluene (3.2 cm³) and the reaction mixture further degassed for 30 minutes. Tris(dibenzylideneacetone)dipalladium(0) (19.0 mg, 0.03 mmol) was then added and the mixture heated at 110° C. in a pre-heated block for 17 hours. Bromo-benzene (0.02 cm³) was added and the mixture stirred at 110° C. for 30 minutes followed by addition of phenyl tributyltin (0.07 cm³). The reaction mixture was then heated at 110° C. for a further 60 minutes. The reaction mixture was allowed to cool slightly, poured into stirred methanol (300 cm³) and washed with acetone (50 cm³). The solid was collected by filtration and subjected to sequential Soxhlet extraction: acetone, 40-60 petrol, 80-100 petrol, cyclohexanes and chloroform. The chloroform extract was poured into stirred methanol (500 cm³) and the solid collected by filtration to give polymer 17 (216 mg, 66%) as a black solid.

GPC (chlorobenzene, 50° C.) $M_n$=23,700 g/mol, $M_w$=59,700 g/mol.

Example 15—Bulk Heterojunction Organic Photodetector Devices (OPDs)

Devices were fabricated onto glass substrates with six pre-patterned ITO dots of 5 mm diameter to provide the bottom electrode. The ITO substrates were cleaned using a standard process of ultrasonication in Decon90 solution (30 minutes) followed by washing with deionized water (×3) and ultrasonication in deionized water (30 minutes). The ZnO ETL layer was deposited by spin coating a ZnO nanoparticle dispersion onto the substrate and drying on a hotplate for 10 minutes at a temperature between 100 and 140° C. A formulation of polymer and [6,6]-phenyl-$C_{71}$-butyric acid methyl ester (PCBM[C70]) was prepared at a 1:1.5 ratio in 1,2-dichlorobenzene at a concentration of 20 mg/ml, and stirred for 17 hours at 60° C. The formulation was then filtered through a 0.2 μm PTFE filter and the formulation used to coat the active layer. The active layer was deposited using blade coating (K101 Control Coater System from RK), with the stage temperature set to 70° C., the blade gap set to between 2 and 15 μm and the speed set to between 2 and 8 m/min, targeting a final dry film thickness of ca. 500 nm. Following coating the active layer was annealed at 100° C. for 10 minutes. The $MoO_3$ HTL layer was deposited by E-beam vacuum deposition from $MoO_3$ pellets at a rate of 1 A/s, targeting 15 nm thickness. Finally, the top silver electrode was deposited by thermal evaporation through a shadow mask, to achieve Ag thickness of between 40 and 80 nm.

The J-V curves were measured using a Keithley 4200 system under light and dark conditions at a bias from +5 to −5 V with a 580 nm LED with power 0.5 mW/cm² as light source.

The EQE of OPD devices were characterized between 400 and 1100 nm under −2V bias, using an External Quantum Efficiency (EQE) Measurement System from LOT-QuantumDesign Europe.

Figure 2:
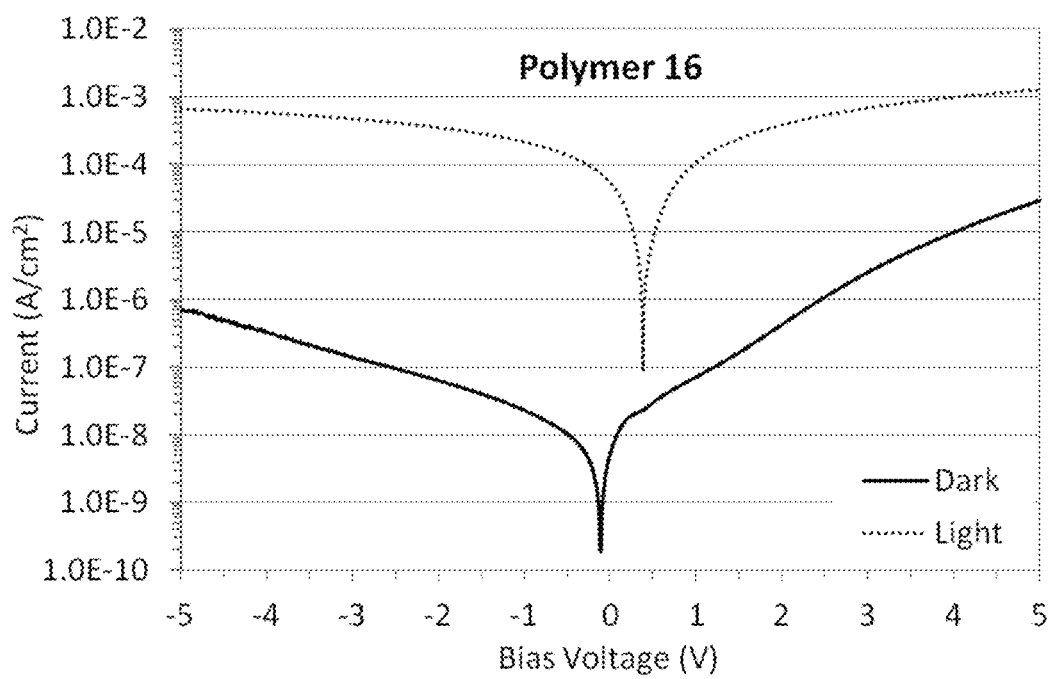
FIG. 2 shows a typical J-V curve for an OPD device comprising Polymer 16.
Figure 3:
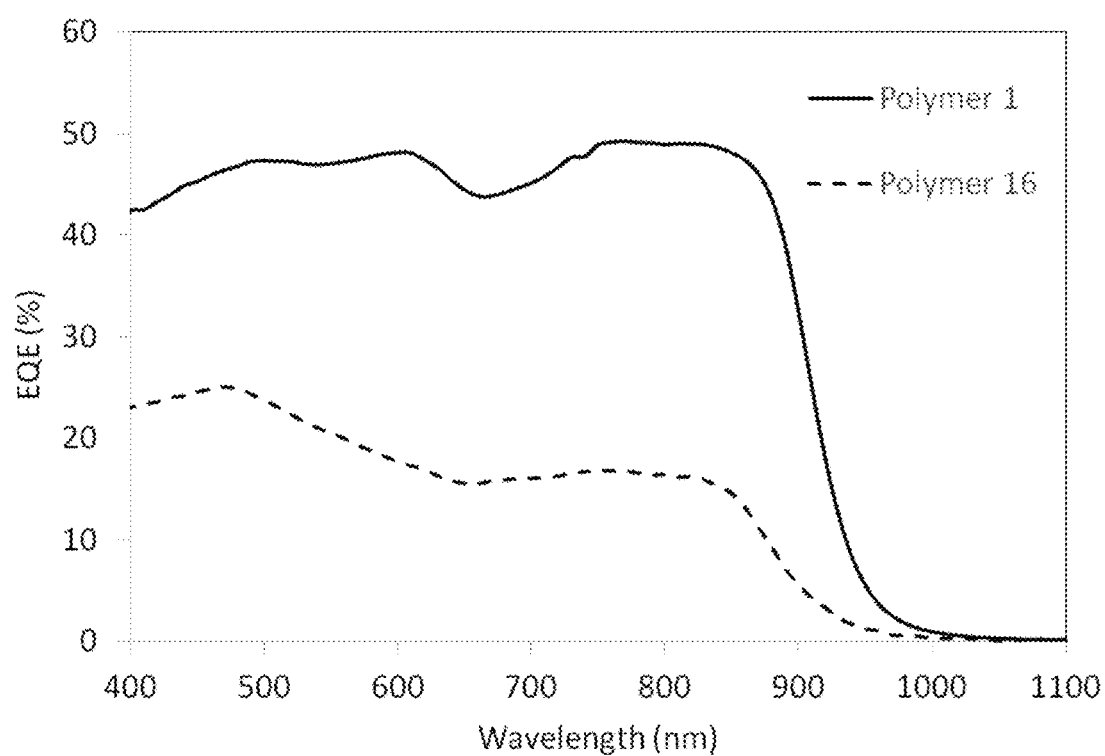
FIG. 3 shows the EQE spectra for Polymers 1 and 16.

Typical J-V curves for OPD devices comprising polymers 1 and 16 are shown in FIGS. 1 and 2, respectively, and the EQE spectra for the same polymers are shown in FIG. 3.

Results for EQE measurements at 850 nm for Polymers 1, 13, 16 and 17 are given in Table 2.

TABLE 2

| Polymer | EQE (850 nm) |
|---------|--------------|
| 1 | 48% |
| 13 | 29% |
| 16 | 15% |
| 17 | 18% |

The experimental data clearly show that the present polymers are characterized by excellent EQE as well as surprisingly good solubility in solvents commonly used in the manufacturing of organic electronic devices. The present polymers are therefore considered to be extremely well suited for large-scale production, particularly by printing methods, of organic electronic devices, particularly for organic photodetectors.

The invention claimed is:

1. A polymer comprising
   (i) a first monomer unit $M^1$ of formula (I) in a first molar ratio $m_1$

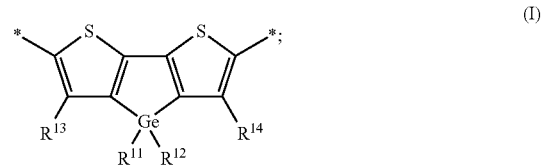

(I)

(ii) a second monomer unit $M^2$ of formula (II) in a second molar ratio $m_2$

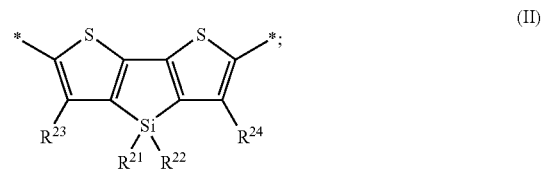

(II)

(iii) one or more third monomer units $M^3$, each being independently of each other selected from the group consisting of formula (III), formula (IV), formula (V), and formula (VI), in a third molar ratio $m_3$,

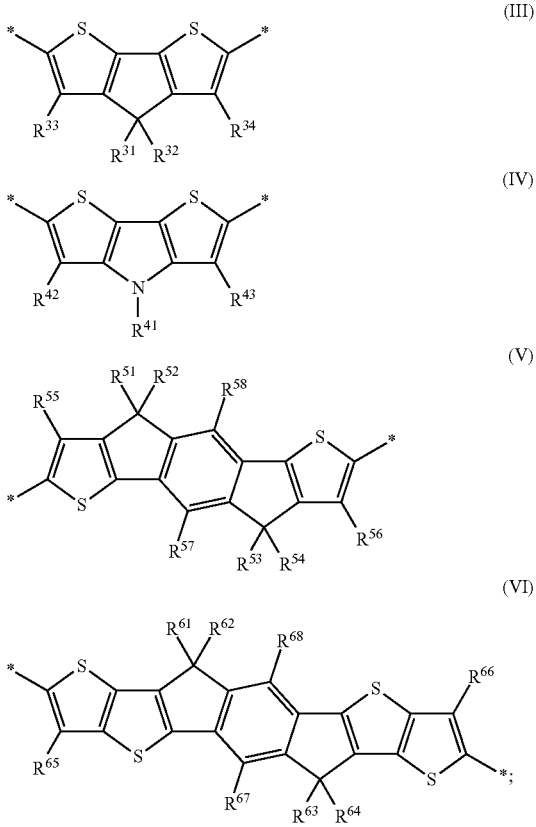

(iv) one or more fourth monomer units $M^4$, each independently of the other, selected from one or more electron donors comprising a group selected from the group consisting of aryl, heteroaryl, ethene-2,1-diyl (*—$(R^{81})C$=$C(R^{82})$—*) and ethyndiyl (*—C≡C—*), wherein such aryl or heteroaryl group is different from formulae (I) to (VI), in a fourth molar ratio $m_4$; and (v) a fifth monomer unit $M^5$ of formula (VII) in a fifth molar ratio $m_5$,

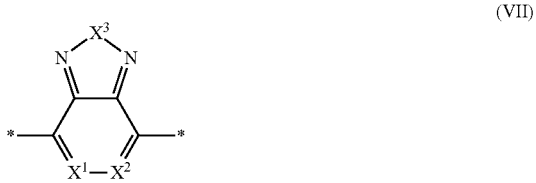

wherein, independently at each occurrence, one of $X^1$ and $X^2$ is N and the other is C—$R^{71}$, and $X^3$ is at each occurrence independently selected from the group consisting of O, S, Te, Se and N—$R^{91}$, wherein the sum of first molar ratio $m_1$ and second molar ratio $m_2$ is at least 0.10 and at most 0.90, the third molar ratio $m_3$ is at least 0 and at most 0.80,
the fourth molar ratio $m_4$ is at least 0 and at most 0.20,
the fifth molar ratio $m_5$ is at least 0.10 and at most 0.90, and
the sum of the molar ratios $m_1+m_2+m_3+m_4+m_5=1$,
with the respective molar ratios $m_1$ to $m_5$ being relative to the total number of monomer units $M^1$ to $M^5$, and
wherein, independently at each occurrence, $R^{11}$ to $R^{14}$, $R^{21}$ to $R^{24}$, $R^{31}$ to $R^{34}$, $R^{41}$ to $R^{43}$, $R^{51}$ to $R^{58}$, $R^{61}$ to $R^{68}$, $R^{71}$, $R^{81}$ to $R^{82}$ and $R^{91}$ are independently of each other H or a carbyl group.

2. The polymer according to claim 1, wherein at least 50% of the first monomer units $M^1$ comprised in the polymer are comprised in a first sequence unit $S^1$, wherein the first monomer unit $M^1$ is adjacent to at least one monomer unit of formula (VII).

3. The polymer according to claim 1, wherein at least 50% of the second monomer units $M^2$ comprised in the polymer are comprised in a second sequence unit $S^2$, wherein the second monomer unit $M^2$ is adjacent to at least one monomer unit of formula (VII).

4. The polymer according to claim 1, wherein at least 50% of the third monomer units $M^3$ comprised in the polymer are comprised in a third sequence unit $S^3$, wherein the third monomer unit $M^3$ is adjacent to at least one monomer unit of formula (VII).

5. The polymer according to claim 1, wherein at least 50% of the fourth monomer units $M^4$ comprised in the polymer are comprised in a fourth sequence unit $S^4$, wherein the fourth monomer unit $M^4$ is adjacent to at least one monomer unit of formula (VII).

6. The polymer according to claim 1, wherein said polymer comprises a sequence unit $S^1$ of formula (S-I)

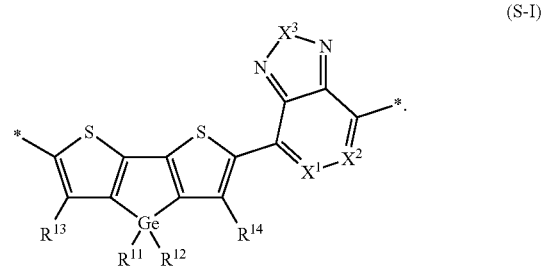

7. The polymer according to claim 1, wherein said polymer comprises a second sequence unit $S^2$ of formula (S-II)

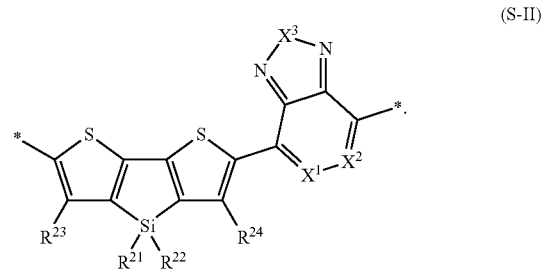

8. The polymer according to claim 1, wherein said polymer comprises one or more third sequence units $S^3$ which are, independently of each other selected from the group consisting of formula (S-III), formula (S-IV), formula (S-V), and formula (S-VI)

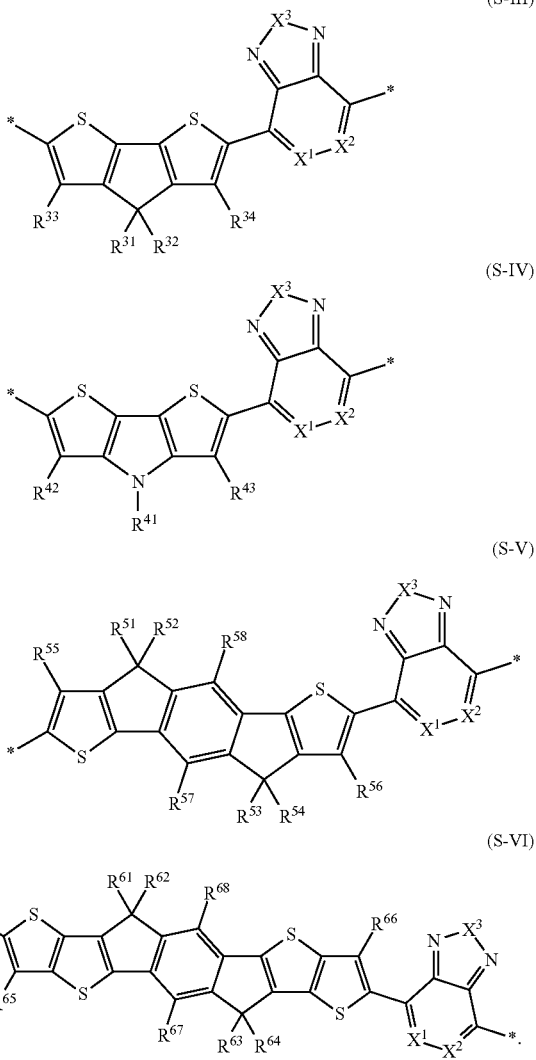

9. The polymer according to claim 1, wherein said polymer comprises one or more fourth sequence unit S⁴ of formula (S-VII)

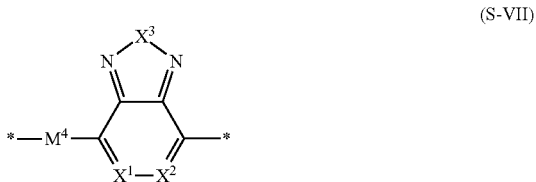

wherein M⁴ is at each occurrence independently as defined above.

10. The polymer according to claim 1, wherein for $m_3>0$ the ratio $(m_1+m_2)/m_3$ is at least 1 and at most 100.

11. The polymer according to claim 1, wherein the first molar ratio $m_1$ is at least 0.10.

12. The polymer according to claim 1, wherein if $m_1=0$ or $m_2=0$ then $m_3$ is at least 0.10 and at most 0.80.

13. A mixture or a blend comprising one or more polymers of claim 1 and one or more compounds or polymers selected from the group consisting of binders and compounds or polymers having semiconducting, charge transport, hole transport, electron transport, hole blocking, electron blocking, electrically conducting, photoconducting or light emitting properties.

14. A charge transport, semiconducting, electrically conducting, photoconducting or light emitting material comprising a polymer of claim 1.

15. A component or device comprising the polymer of claim 1, said component or device being selected from the group consisting of organic field effect transistors, thin film transistors, integrated circuits, logic circuits, capacitors, radio frequency identification tags, devices or components, organic light emitting diodes, organic light emitting transistors, flat panel displays, backlights of displays, organic photovoltaic devices, organic solar cells, photodiodes, laser diodes, photoconductors, organic photodetectors, electrophotographic devices, electrophotographic recording devices, organic memory devices, sensor devices, charge injection layers, charge transport layers or interlayers in polymer light emitting diodes (PLEDs), Schottky diodes, planarizing layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

16. A component or device according to claim 15, wherein said component or device is an organic photodetector.

17. The polymer according to claim 1, wherein said polymer contains at least 50 wt % of monomer units M¹ to M⁵.

18. The polymer according to claim 1, wherein $m_1=0$ or $m_2=0$ and $m_3$ is at least 0.10 and at most 0.80.

19. The polymer according to claim 1, wherein $m_4$ is at least 0.01.

20. The polymer according to claim 1, wherein $m_5$ is at least 0.15 and at most 0.85.

21. The polymer according to claim 1, wherein $m_3>0$ and the ratio $(m_1+m_2)/m_3$ is at least 1 and at most 100.

22. The polymer according to claim 1, wherein the polymer has a molecular weight $M_n$ of at least 5,000 g/mol and at most 250,000 g/mol.

23. The polymer according to claim 1, wherein said polymer does not contain monomer units of optionally substituted benzo[1,2-b;4,5-b']dithiophene.

* * * * *